US011770975B2

(12) United States Patent
Chang et al.

(10) Patent No.: US 11,770,975 B2
(45) Date of Patent: Sep. 26, 2023

(54) ACOUSTIC SENSOR SELF-INDUCED INTERFERENCE CONTROL

(71) Applicant: Halliburton Energy Services, Inc., Houston, TX (US)

(72) Inventors: Chung Chang, Houston, TX (US); Jing Jin, Singapore (SG); Richard Timothy Coates, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 776 days.

(21) Appl. No.: 16/866,747

(22) Filed: May 5, 2020

(65) Prior Publication Data
US 2021/0074904 A1 Mar. 11, 2021

Related U.S. Application Data

(63) Continuation of application No. PCT/US2019/050173, filed on Sep. 9, 2019.

(51) Int. Cl.
*H01L 41/113* (2006.01)
*B06B 1/06* (2006.01)
*G01N 29/24* (2006.01)
*H10N 30/30* (2023.01)
*B06B 1/02* (2006.01)
(Continued)

(52) U.S. Cl.
CPC ......... *H10N 30/302* (2023.02); *B06B 1/0215* (2013.01); *B06B 1/0614* (2013.01); *E21B 47/00* (2013.01); *G01N 29/2437* (2013.01); *G01N 29/30* (2013.01); *G01N 2291/044* (2013.01); *G01V 2001/526* (2013.01)

(58) Field of Classification Search
CPC .. H10N 30/302; B06B 1/0215; B06B 1/0614; G10N 29/2437; G10N 29/30
See application file for complete search history.

(56) References Cited

U.S. PATENT DOCUMENTS 4,928,264 A 5/1990 Kahn
5,486,734 A 1/1996 Seyed-Bolorforosh
(Continued)

FOREIGN PATENT DOCUMENTS

EP 0015886 A1 9/1980
JP 05180811 A 7/1993

OTHER PUBLICATIONS

U.S. Appl. No. 16/438,167, Non-Final Office Action, dated May 27, 2021.
(Continued)

*Primary Examiner* — Derek J Rosenau
(74) *Attorney, Agent, or Firm* — DELIZIO, PEACOCK, LEWIN & GUERRA

(57) ABSTRACT

Methods, systems and devices are disclosed for controlling self-induced acoustic interference. In one embodiment, a first piezoelectric transducer to which a first excitation signal is applied, generates back side acoustic waves that are transmitted from a back side of the first piezoelectric transducer into a backing material layer. A second piezoelectric transducer coupled to a back side of the backing material layer generates a first calibration response to the back side acoustic waves. An interference signal profile is generated based, at least in part, on the first calibration response and may be used to filter interference signal components and/or to generate a control signal to be applied to the second piezoelectric transducer during measurement cycles.

18 Claims, 14 Drawing Sheets

(51) Int. Cl.
    *E21B 47/00*     (2012.01)
    *G01N 29/30*     (2006.01)
    *G01V 1/52*     (2006.01)

(56) References Cited

U.S. PATENT DOCUMENTS

| | | |
|---|---|---|
| 8,264,126 B2 | 9/2012 | Toda et al. |
| 8,570,837 B2 | 10/2013 | Toda et al. |
| 8,689,639 B2 | 4/2014 | Berger |
| 9,050,628 B2 | 6/2015 | Lautzenhiser et al. |
| 9,154,057 B2 | 10/2015 | Akiyama et al. |
| 9,473,106 B2 | 10/2016 | Wathen et al. |
| 2005/0002276 A1 | 1/2005 | Yogeswaren et al. |
| 2007/0113654 A1 | 5/2007 | Carim et al. |
| 2009/0230969 A1 | 9/2009 | Hall et al. |
| 2011/0178407 A1 | 7/2011 | Lu et al. |
| 2013/0241356 A1 | 9/2013 | Kim et al. |
| 2014/0373619 A1 | 12/2014 | Slay et al. |
| 2016/0296975 A1 | 10/2016 | Lukacs et al. |
| 2017/0299751 A1 | 10/2017 | Chang et al. |
| 2019/0302036 A1 | 10/2019 | Fischer et al. |
| 2019/0302063 A1 | 10/2019 | Hadimioglu et al. |
| 2020/0391247 A1 | 12/2020 | Jin et al. |

OTHER PUBLICATIONS

PCT Application Serial No. PCT/US2019/036610, International Search Report, dated Mar. 5, 2020, 3 pages.
PCT Application Serial No. PCT/US2019/036610, International Written Opinion, dated Mar. 5, 2020, 8 pages.
PCT Application Serial No. PCT/US2019/050173, International Search Report, dated Jun. 8, 2020, 4 pages.
PCT Application Serial No. PCT/US2019/050173, International Written Opinion, dated Jun. 8, 2020, 6 pages.
U.S. Appl. No. 16/438,167; Final Rejection; dated Aug 2, 2021, 29 pages.
"PCT Application No. PCT/US2019/050173 International Preliminary Report on Patentability", dated Mar. 17, 2022, 8 pages.
"PCT Application No. PCT/US2019/036610, International Preliminary Report on Patentability", dated Dec. 23, 2021, 10 pages.
"U.S. Appl. No. 16/438,167, Final Office Action", dated Mar. 31, 2022, 29 pages.

ACOUSTIC SENSOR SELF-INDUCED INTERFERENCE CONTROL

TECHNICAL FIELD

The disclosure generally relates to the field of acoustic sensors and in particular to design and utilization of piezoelectric acoustic sensors.

BACKGROUND ART

In oilfield services operations, acoustic sensors that employ piezoelectric transducers are used for various measurement and imaging operations. Such operations may be utilized for immersed mud caliper measurements, formation properties identification, etc. Acoustic signals such as ultrasonic signals generated by piezoelectric transducers may be substantially attenuated when propagating through drilling mud or other downhole wellbore substances. Attenuation of the returning reflected and/or refracted acoustic signals in some high-density downhole fluid environments may reduce the accuracy and consistency of piezoelectric transducer data due to reduced signal-to-noise ratio (SNR). Self-induced acoustic interference further degrades acoustic sensor performance by further reducing the SNR.

BRIEF DESCRIPTION OF THE DRAWINGS

Embodiments of the disclosure may be better understood by referencing the accompanying drawings.

DESCRIPTION OF EMBODIMENTS

Figure 1A:
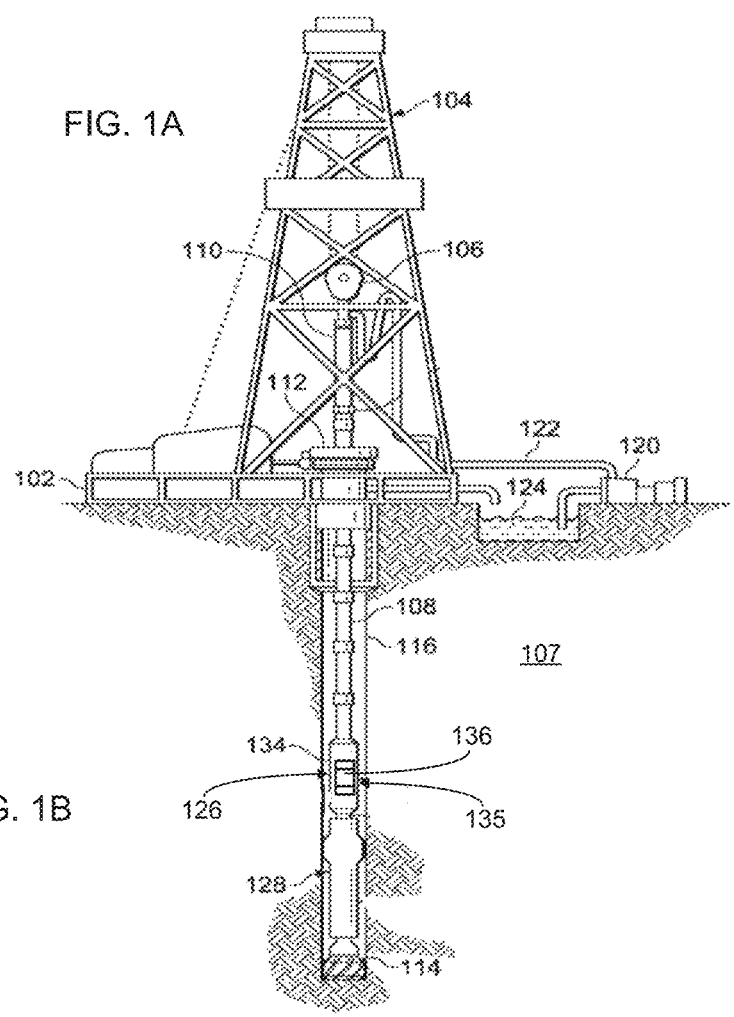
FIG. 1A is a conceptual, partial cutaway diagram depicting an example drilling system, according to some embodiments.

The description that follows includes example systems, methods, techniques, and program flows that embody embodiments of the disclosure. However, it is understood that this disclosure may be practiced without these specific details. In other instances, well-known instruction instances, protocols, structures and techniques have not been shown in detail in order not to obfuscate the description.

Overview

Embodiments address issues relating to obtaining consistently accurate acoustic signal information from a downhole acoustic sensor that utilizes one or more piezoelectric transducers. In some embodiments, a logging tool comprises a tool housing within which an acoustic sensor and sensor controller are deployed within a wellbore. The acoustic sensor is configured to periodically generate acoustic signals, such as ultrasonic pulses, that propagate into and through a wellbore in which the logging tool is positioned.

The acoustic sensor includes a first piezoelectric transducer, referred to herein as a primary transducer, and a second piezoelectric transducer, referred to herein as a secondary transducer. The primary transducer is configured in combination with a controller to operate as an acoustic transceiver that generates acoustic waves and detects an acoustic response comprising acoustic logging data. The secondary transducer is configured in combination with the controller and the primary transducer to monitor and measure transceiver reverberation characteristics. The measured transceiver reverberation characteristics are utilized in some embodiments to optimize logging output by either filtering reverberation interference and/or actively reducing the amplitude of reverberation interference.

The acoustic sensor comprises a primary piezoelectric transducer having a radially outward facing front side from which the acoustic signals propagate into the wellbore. The acoustic sensor further includes a backing material layer coupled to a back side of the primary transducer to attenuate back side acoustic waves generated by the primary transducer. The backing material layer comprises acoustic attenuating/damping material formed to include a front side that is coupled to the back side of the primary transducer and a back side from which acoustic waves may reflect back to the primary transducer. The acoustic sensor further includes a secondary transducer coupled to the back side of the backing material layer. The secondary (back side) transducer may be configured as an acoustic transceiver to generate and detect back side calibration signals.

In some embodiments, the acoustic sensor is configured to filter or otherwise remove internally induced interference signal components using sample responses from the primary and secondary transducers. In such embodiments, the secondary transducer is configured to detect the back side acoustic waves generated by the primary transducer and generate a corresponding back side response used for sensor calibration. The secondary transducer is further configured to generate acoustic waves detected by the primary transducer. The primary transducer generates a calibration response that is used in combination with the back side response to determine transfer functions that associate the back side response and calibration response to temporally corresponding transducer input signals. The sensor controller or other processing electronics may process the transfer function information in combination with transducer pulse input information to determine an interference response. The interference response may be determined as one or more electric response components that correspond to internally induced reflection interference that may occur during acoustic measurement cycles. The sensor controller or post-measurement processing components may be configured to remove signal components corresponding to the determined interference response from measured acoustic responses.

In some embodiments, the acoustic sensor is configured to cancel internally induced interference signal components using acoustic cancellation signals in the form of acoustic waves generated by the secondary transducer in response to an input control signal. In such embodiments, the sensor controller and/or other signal processing components are configured to determine a correction excitation input signal to be applied to the secondary transducer to partially or fully cancel the back side acoustic waves generated by the primary transducer. For example, the acoustic sensor may be configured to determine the control signal by measuring parameters of electric signal responses of the primary transducer to back side acoustic waves reflected from the back side of the backing material layer. The acoustic sensor may be further configured to measure parameters of electric signal responses of the secondary transducer to the back side acoustic waves.

The signal response parameters from the primary and secondary transducers and the corresponding transducer input signals may be processed to determine frequency shifts between transducer excitation input signals and corresponding response signals. The signal response parameters are also processed to determine a phase offset between the backside response and the corresponding input excitation signal and an amplitude difference between the back side response and the interference response detected by the primary transducer. The input excitation and response parameters are collected during one or more calibration cycles and utilized to calculate or otherwise determine control signals to be applied to the secondary transducer during measurement cycles to partially or fully cancel back side acoustic waves generated by the primary transducer.

Example Illustrations

FIG. 1A depicts an example drilling system including components configured to implement logging-while-drilling (LWD) or measuring-while-drilling (MWD), according to some embodiments. In FIG. 1A, a tool string 126 is disposed in a borehole 116 that is formed within a formation region 107. The tool string 126 includes a rotary steerable system (RSS) 128 in accordance with various embodiments. A drilling platform 102 supports a derrick 104 having a traveling block 106 for raising and lowering a drill string 108. A kelly 110 supports the drill string 108 as it is lowered through a rotary table 113. In some embodiments, a topdrive is used in place of the kelly 110 and the rotary table 113. A drill bit 114 is driven by a downhole motor or RSS, and/or rotation of the drill string 108. As bit 114 rotates, it creates the borehole 116 that passes through various downhole strata 118. A pump 120 circulates drilling fluid through a feed pipe 122 and downhole through the interior of drill string 108, through orifices in drill bit 114, back to the surface via the annulus around drill string 108, and into a retention pit 124. The drilling fluid transports cuttings from the borehole into the pit 124 and aids in maintaining the borehole integrity.

Tool string 126 includes a logging tool 134 that collects measurements relating to various formation properties as well as the bit position and various other drilling conditions as bit 114 extends borehole 116 through the downhole strata 118. Logging tool 134 includes a sensor system 135 that is configured to transmit acoustic signals within cased and/or uncased sections of borehole 116 and consequently induce corresponding acoustic echo responses from the various layers of formation region 107. To this end, sensor system 135 includes one or more acoustic sensors 136 that are configured to generate, transmit, receive, and process acoustic wave signals such as in the form of ultrasonic waves.

Figure 1B:
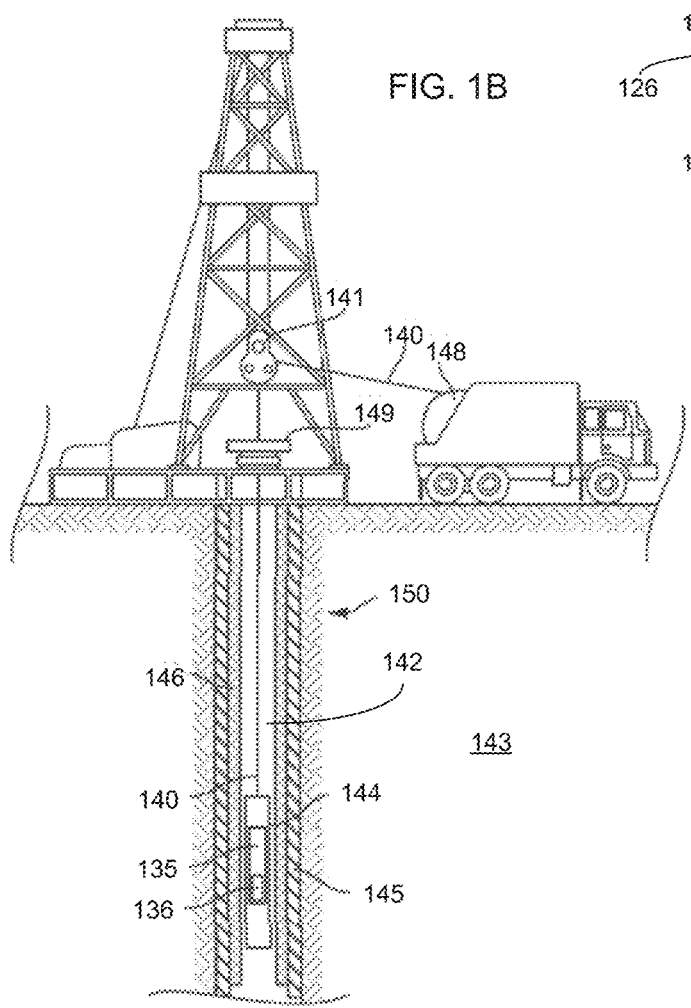
FIG. 1B is a partial cutaway diagram depicting an example wireline system in accordance with some embodiments.

FIG. 1B depicts a partial cross-section view of a well system that includes downhole acoustic measurement components implemented in a wireline logging configuration that incorporates sensor system 135 in accordance with some embodiments. The well system includes a wellbore 142 extending through various earth strata in a subterranean region 143. An annular casing 146 extends from the surface into the subterranean region 143. Casing 146 may be attached to the walls of the wellbore via cement encasement provided by a cement sheath 145 formed between casing 146 and the substantially annular wall of wellbore 142.

The well system further includes at least one wireline logging tool 144 that may be configured as a wellbore evaluation tool and/or a formation evaluation tool. Logging tool 144 is coupled to a conveyance component 140 that, in the depicted embodiment, comprises a wireline deployed into wellbore 142. Conveyance component 140 may be extended into wellbore 142 using, for example, a winch and guide 141. Logging tool 144 includes sensor system 135 that, as explained with reference to FIG. 1A, is configured to transmit acoustic signals within cased and/or uncased sections of wellbore 142 and consequently induce corresponding acoustic echo responses from the various layers formed by casing 146, cement 145, and formation region 143.

As explained in further detail with reference to FIGS. 2A, 2B, and 2C, acoustic sensors 136 may include a pair of piezoelectric transducers. Each of the transducers and associated control circuitry are configured as acoustic transceivers, including piezoelectric material and electrode features for converting electrical excitation signals into mechanical vibrations that propagate as acoustic waves and for converting received acoustic waves into electrical response signals. For piezoelectric transceivers, the acoustic waves may be ultrasonic waves. The pair of transducers are mutually configured within a single sensor unit in a functionally complementary manner in which a first of the transducers, also referred to as the primary transducer, is utilized to collect acoustic measurement information during measurement cycles. For instance, the primary transducer within each of acoustic sensors 136 has a front side from which acoustic waves are transmitted radially outward into wellbore 107, and an opposing back side. Acoustic sensors 136 may further include a cover layer attached to the front side of the primary transducer that faces radially outward to protect the transducer from the fluid environment within a wellbore such as borehole 116 or wellbore 142. As depicted and described in further detail at least with reference to FIGS. 2C, 4, 5, 6, 7, 8, and 11, each of acoustic sensors 136 further includes a backing material layer attached or otherwise coupled to the back side of the primary transducer. The backing material comprises acoustic damping material such as ultrasonic attenuation material that is compositionally and structurally configured to attenuate acoustic waves emitted from the back side of the transducer.

The second transducer within each of acoustic sensors 136, also referred to as the secondary transducer, is attached to the back side of the back material layer and is configured to collect sensor calibration information during calibration cycles. In some embodiments, calibration information is collected using the front side primary transducer and the back side secondary transducer and used to determine an interference signal profile. The interference signal profile may be utilized by the sensor or other signal processing components to remove self-induced acoustic reflection interference and/or to cancel back side acoustic waves that would otherwise induce such interference.

Sensor system 135 is further configured to include sensor electronics configured to provide electrical excitation pulse signals that are converted by the primary and secondary transducers of acoustic sensors 136 into acoustic signals. In some examples, the acoustic signals may comprise ultrasonic pressure waves transmitted at frequencies of or greater than 20 kHz. The external acoustic medium within a wellbore may include liquid and/or gaseous fluids such as oil, water, drilling fluid/mud, etc. The acoustic waves propagate from a front side of the primary transducer within each of acoustic sensors 136 and propagate through wellbore, casing, and/or formation material media including fluid and solid materials and reflect or refract from one or more features within and/or external to a wellbore. For example, the acoustic waves may reflect from material surfaces and inter-material boundaries within a wellbore, a casing string, a cement sheath, a formation region, or any combination of these.

Sensor system 135 is further configured to detect the returning reflected or refracted acoustic waves and analyze one or more characteristics of the detected waves. The transducers within sensor system 135 may be configured as a transceiver that generates acoustic signals, such as acoustic pulses, during pulse periods, and receives and translates the returning acoustic echo signals into electrical signals during echo response periods, referred to herein alternatively as echo response phases or response phases. Sensor system 135 may be further configured using electronics and programmatic processing components to determine material and/or structural characteristics of a wellbore by processing characteristics of the detected acoustic echo waves. To perform a caliper function within a wellbore, sensor system 135 may compare a time and/or period at or within which sensor system 135 generates an excitation pulse to a later time/period at/within which sensor system 135 detects a reflection or refraction of the excitation pulse to determine a transmit-to-receive time lapse/difference. In some examples, sensor system 135 is configured to determine profile characteristics of a wellbore based on the time difference and/or amplitude difference. Alternatively or in addition, sensor system 135 may be configured to determine a location, type, sound velocity, or material of an object in or on a wellbore based on the time difference and/or amplitude difference. For example, sensor system 135 may determine that a detected object is a portion of a wall of the wellbore, that the object is located a particular distance from sensor system 135 or a logging tool in which sensor system 135 is disposed, that the object includes a particular material, or any combination of these.

As depicted and described in further detail with reference to FIGS. 2-15, each of acoustic sensors 136 may include an ultrasonic transceiver comprising a primary piezoelectric transducer and associated controller electronics and a secondary transducer configured to facilitate runtime calibration of acoustic sensors 136. The primary and secondary transducers each comprise a piezoelectric material layer and electrodes coupled across a width dimension. During each measurement cycle, an excitation pulse is applied to the electrodes of the primary transducer to induce an ultrasonic vibration in the piezoelectric material layer. The ultrasonic vibration is mechanically transferred across a front side of the primary transducer as transmit pulses that induce acoustic echoes via reflection/refraction that are subsequently detected by the primary transducer during an echo response phase of the measurement cycle. However, internal acoustic reflections of the excitation pulse within the acoustic sensor may induce acoustic interference with the detected response. For example, in addition to the front side waves that propagate into the wellbore, the vibrations of primary transducer induce acoustic waves that propagate through the transducer's back side into the backing material layer. While somewhat attenuated by the material composition and structural design of the backing material layers, the back side acoustic waves reflect from the acoustic boundary formed at the back side of the backing material layer and return to induce interference reverberation in the primary transducer. Such self-induced reflection interference can reduce SNR to below recoverable levels particularly in wellbore environments with heavy drilling mud material that substantially attenuates induced echo signals.

To minimize or effectively prevent self-induced interference, the primary and secondary transducers and associated control electronics within sensor system 135 are configured to reduce or eliminate self-induced reflection interference during the echo response phase of measurement cycles. As depicted and described in further detail with reference to FIGS. 2-15, sensor system 135 may include one or more acoustic sensors such as acoustic sensor 136 and associated sensor controller components configured to remove interference signal components from an overall response signal and/or to generate back side cancellation acoustic waves that cancel or otherwise diminish back side acoustic waves that would otherwise cause the interference.

Figure 2A:
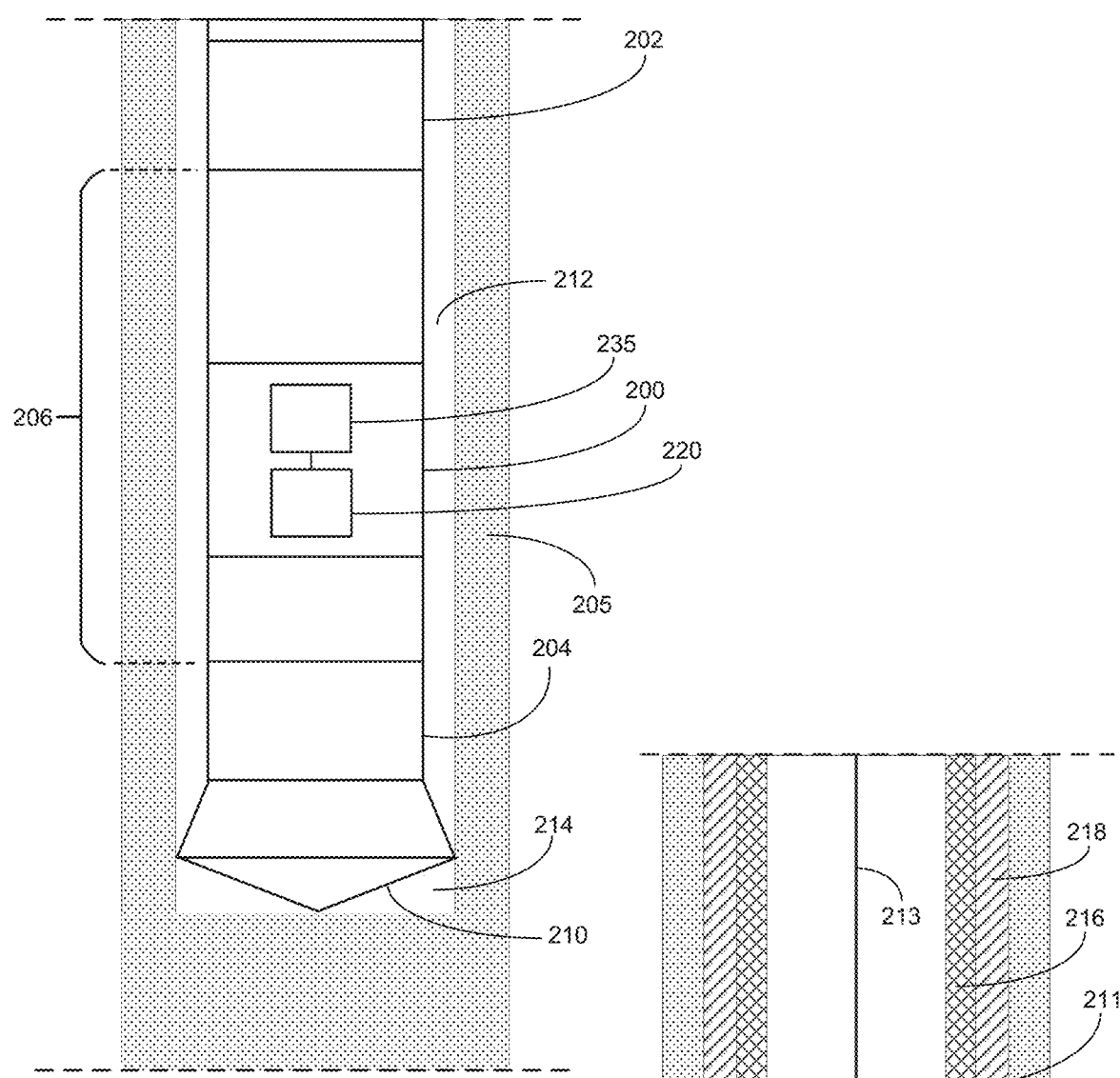
FIG. 2A is a cutaway diagram illustrating a more detailed view of the configuration and deployment of a downhole measurement system that includes an acoustic logging tool implemented in a drilling configuration in accordance with some embodiments.
Figure 2B:
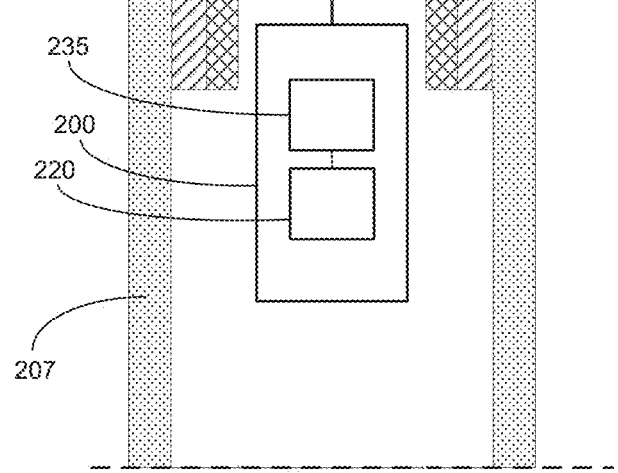
FIG. 2B is a cutaway diagram depicting a more detailed view of the configuration and deployment of a downhole measurement system that includes an acoustic logging tool implemented in a wireline configuration in accordance with some embodiments.

FIGS. 2A and 2B are side cross-section diagrams of wellbore environments that includes an acoustic logging tool 200, in accordance with some embodiments. The side cross-section diagram of FIG. 2A shows downhole measurement components that include logging tool 200 deployed as part of a drill string in a well system configured to implement LWD/MWD such as the well system depicted in FIG. 1A. The well system includes a wellbore 212 formed within a formation region 205.

Logging tool 200 may be a LWD or a MWD tool positioned at various points along the length of wellbore 212 as part of the drill string components. In other embodiments, a logging tool configured substantially similar to logging tool 200 may be deployed as a wireline logging tool such as explained below with reference to FIG. 2B. The depicted drill string components include various subsystems 202, 204, and 206. For example, subsystem 202 may be a communication subsystem comprising communication and telemetry interface components. Subsystem 204 may be a string saver subsystem or a rotary steerable system. Intermediate subsystem 206 may comprise a tubular section (e.g., a mud motor or measuring-while-drilling module) positioned between subsystems 202 and 204. The drill string further includes a drill bit 210 coupled to the lowermost, distal end of the drill string.

Logging tool 200 may be intermittently or continuously re-positioned by extending and retracting the overall drill string within wellbore 209. Logging tool 200 comprises in part one or more acoustic sensors 220 that are configured as piezoelectric transceivers including transmitter and receiver components that may overlap to generate/transmit and receive/process ultrasonic acoustic wave signals. The ultrasonic waves propagate through a pressure-sensitive medium, such as fluid 214 and reflect from one or more surfaces and inter-layer interfaces within, at, and/or beyond wellbore 212. The ultrasonic waves are generated and detected by one or more piezoelectric transducers within each of acoustic sensors 220. Logging tool 200 further includes a controller 235 electronically coupled with acoustic sensors 220. Controller 235 includes acoustic signal processing components that are configured to implement operational modes of acoustic sensors 220 and in some embodiments to determine one or more characteristics of materials and objects within and at wellbore 212 as well as formation material properties based on reflected acoustic waves.

The side cross-section view of FIG. 2B shows downhole measurement components that include logging tool 200 deployed in a wireline logging configuration such as the well system depicted in FIG. 1B. The well system includes a wellbore 211 formed within a casing string 216 that is attached to and surrounded by a cement sheath 218. As shown, wellbore 211 includes a section that extends below casing string 216 and cement sheath 218 and that is bounded by the inner surface of a formation region 207. Logging tool 200 may be positioned and re-positioned at various points along the length of wellbore 211 by extending and retracting a wireline 213 that is coupled to logging tool 200. Logging tool 200 comprises in part one or more acoustic sensors 220 that, as explained with reference to FIG. 2A, are configured as a piezoelectric transceiver including transmitter and receiver components that may overlap to generate/transmit and receive/process ultrasonic acoustic wave signals. The ultrasonic waves are generated and detected by one or more piezoelectric transducers within each of acoustic sensors 220. Controller 235 includes acoustic signal processing components that are configured to control operation of acoustic sensors 220 and in some embodiments to determine one or more characteristics of materials and objects within and at wellbore 211 as well as formation material properties based on reflected acoustic waves.

Figure 2C:
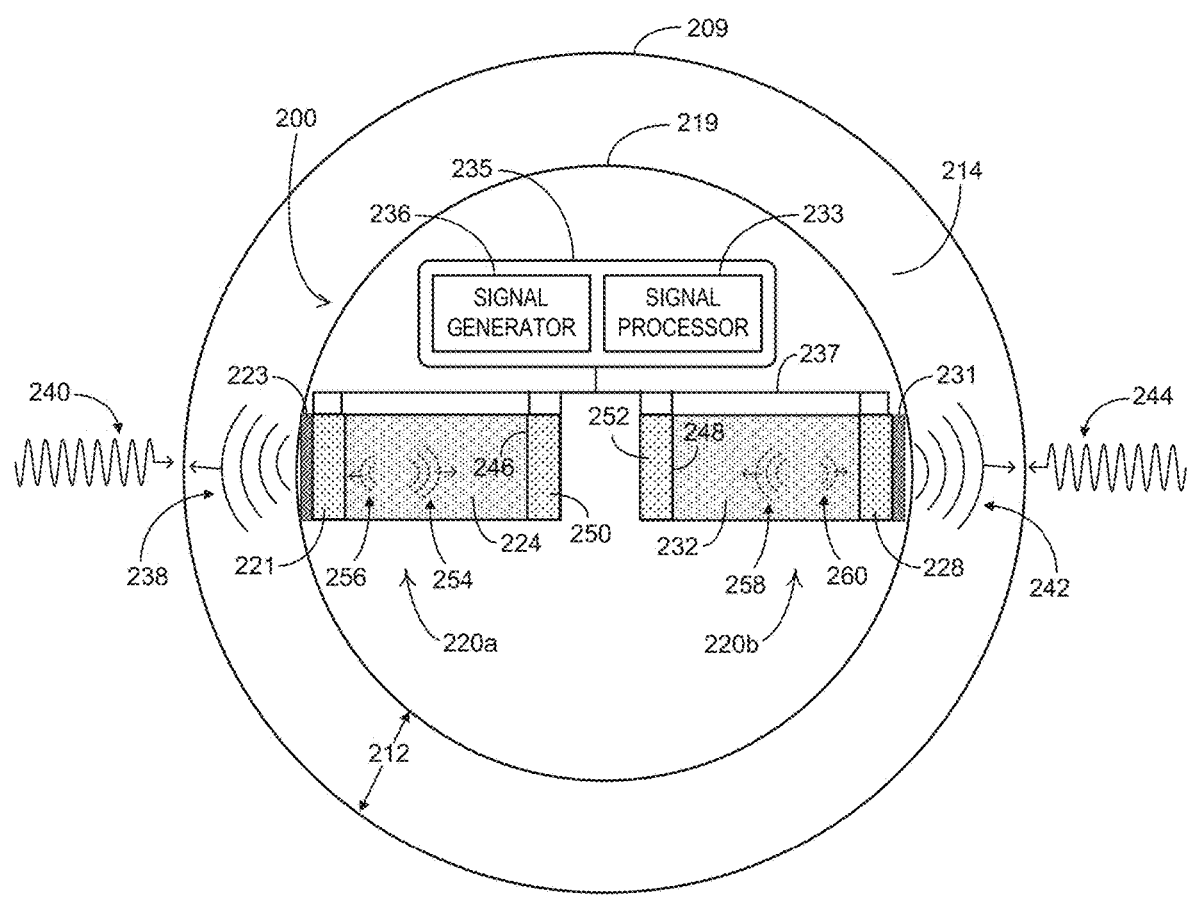
FIG. 2C is an overhead cross-section diagram depicting a logging tool that may be implemented in the drilling configuration depicted in FIG. 2A and in the wireline configuration depicted in FIG. 2B, in accordance with some embodiments.

FIG. 2C is an overhead partial cross-section diagram of acoustic logging tool 200. Acoustic tool 200 comprises acoustic source/transmitting components and acoustic detection and processing components disposed within a tool housing 219. The acoustic transceiver components include a pair of acoustic sensors 220a and 220b that each include a pair of piezoelectric transducers that are electrically, optically, or otherwise communicatively coupled to controller 235.

The pair of transducers within acoustic sensor 220a includes a primary transducer comprising a piezoelectric material layer 221 and a secondary transducer comprising a piezoelectric material layer 250. Each of the primary and secondary transducers within acoustic senor 220a further includes a pair of electrodes (not expressly depicted) coupled to a front side and a back side of piezoelectric material layers 221 and 250 and providing electrical contact and connectivity with controller 235 via a communication interface 237. Acoustic sensor 220a further includes a backing material layer 224 disposed between the primary and secondary transducers. The backing material of backing material layer 224 comprises acoustic attenuation material such as ultrasonic attenuation material that is compositionally and structurally configured to attenuate acoustic waves emitted from the back side of the primary transducer. For example, backing material layer 224 may comprise a block of acoustic damping material such as tungsten rubber that attenuates ultrasonic acoustic wave energy.

Acoustic sensor 220b is configured similarly or identically to acoustic sensor 220a. The pair of transducers within acoustic sensor 220b includes a primary transducer comprising a piezoelectric material layer 228 and a secondary transducer comprising a piezoelectric material layer 252. Each of the primary and secondary transducers within acoustic senor 220b further includes a pair of electrodes (not expressly depicted) coupled to a front side and a back side of piezoelectric material layers 228 and 252 and providing electrical contact and connectivity with controller 235 via communication interface 237. As with acoustic sensor 220a, acoustic sensor 220b further includes a backing material layer 232 that is disposed between the primary and secondary transducers and materially and/or structurally configured to attenuate acoustic wave energy.

Acoustic sensors 220a and 220b further include protective cover layers 223 and 231, respectively, coupled to the radially outward front sides of each of the primary transducers. Each of cover layers 223 and 231 form a fluid impermeable seal preventing fluids from contacting the internal components of acoustic sensors 220a and 220b. In some embodiments, cover layers 223 and 231 may form part of the external surface boundary of tool housing 219. To minimize front side external acoustic reflection during signal transmission and internal acoustic reflection during reception of acoustic echoes, cover layers 223 and 231 comprise material having an acoustic impedance matching the acoustic impedance of the external acoustic medium, such as drilling fluids.

Controller 235 may be a programmable electronics module that is communicatively coupled to the pairs of piezoelectric transducers within acoustic sensors 220a and 220b. Controller 235 is configured, using electronics and program code constructs, to provide excitation pulse signals to one or more of the respective sets of transducer electrodes during a pulse transmit period that may comprise the excitation phase of a measurement cycle. Controller 235 includes a signal generator 236 and a signal processor 233. Signal generator 236 is configured using any combination of hardware and/or program code constructs to generate and send excitation pulse signals to the electrodes via communication interface 237 that may include one or more electrical conduction paths. Signal processor 233 is configured using any combination of hardware and/or program code constructs to detect/measure response signals received from the transducer electrodes via communication interface 237.

Signal generator 236 generates pulse signals comprising alternating current signals and corresponding voltage fluctuations that are applied to the transducer electrodes, resulting in fluctuating electrical fields and corresponding fluctuating electrical charges applied across the piezoelectric layers 221, 250, 228, and 252. Piezoelectric effect results in changes to mechanical stress and consequent mechanical deformation of piezoelectric material layers 221, 250, 228, and 252. The mechanical deformation corresponds in terms of frequency and amplitude to the frequency and amplitude of the received electrical excitations signals, resulting in an ultrasonic vibration of piezoelectric layers 221, 250, 228, and 252. The ultrasonic vibration of the piezoelectric layers 221, 250, 228, and 252 mechanically induces corresponding ultrasonic pressure waves such as within fluid medium 214 from the primary transducers. The acoustic pressure waves generated by the primary transducers of acoustic sensors 220a and 220b, such as sensor pulses 238 and 242, propagate through wellbore annulus 212. Sensor pulses 238 and 242 induce corresponding acoustic echo signals 240 and 244 that result from reflection and/or refraction from various downhole acoustic boundaries.

Sensor pulses 238 and 242 are generated periodically, intermittently, or otherwise as part of individual measurement cycles. Each measurement cycle begins with an excitation phase during which signal generator 236 applies an electrical excitation that induces corresponding acoustic pulses in the primary transducer(s) to which the excitation is applied. Each measurement cycle further includes an echo response phase such as may be defined and implemented by signal processor components 233. During the echo response phase of each measurement cycle, signal processor components 233 detect and process acoustic echo responses 240 and 244.

Controller 235 and the primary transducers within acoustic sensors 220a and 220b are configured in one aspect to perform an acoustic logging function. The primary transducers and controller 235 are configured to collect acoustic information by generating and transmitting acoustic waves such as in the form of sensor pulses 238 and 242 into wellbore annulus 212 and detecting corresponding acoustic echo signals 240 and 244 during acoustic measurement cycles. In addition to generating the radially outward transmitted acoustic pulses, the ultrasonic vibrations induce back side acoustic waves that may result in internal, self-induced sensor interference. For example, the excitation input induces the primary transducers within acoustic sensors 220a and 220b to generate sensor pulses 238 and 242 and to simultaneously generate back side acoustic waves 254 and 258, respectively, that when reflected back into the source transducer may induce reverberation interference.

Self-induced interference may be caused by reflections of back side acoustic waves from acoustic boundaries formed by the back sides 246 and 248 of each of the backing material layers 224 and 232. The signal characteristics such as frequency of the backside waves 254 and 258 may largely align with corresponding characteristics of echo response signals 240 and 244. Portions of back side acoustic waves 254 and 258 may be reflected from back sides 246 and 248 as well as other acoustic boundaries at the edges of and/or within backing material layers 224 and 232. Example reflected portions are depicted as reflected back side acoustic waves 256 and 260. If received within the same or overlapping time window as the echo response phase of the measurement cycles, the reflected portions of back side acoustic waves 254 and 258 induce reverberations in the piezoelectric layers that substantially reduce SNR for each measurement cycle. Backing material layers 224 and 232 are positioned to mitigate self-induced reverberation interference within acoustic sensors 220a and 220b. Back side acoustic waves 254 and 258 propagate through backing material layers 224 and 232 and are at least partially attenuated therein.

To facilitate the acoustic logging function, controller 235 and acoustic sensors 220a and 220b may be configured to adaptively reduce self-induced acoustic noise during measurement cycles. In some embodiments, the noise reduction components are configured to determine an interference signal profile based on calibration response information from and the secondary and/or primary transducers. The primary transducers and controller 235 are also configured to operate in conjunction with the secondary transducers to partially or fully remove or prevent, such as by filtering or actively canceling, self-induced acoustic interference for each of acoustic sensors 220a and 220b. In some embodiments, controller 235 implements one or more calibration cycles during which the primary and secondary transducers of each of acoustic sensors 220a and 220b are used to sample acoustic waves propagating through backing material layers 224 and 232. The sampled information is processed by controller 235 to determine signal parameters that may be utilized to filter interference signal components and/or to prevent interference by actively canceling interference signal components.

In some embodiments, the sampled information collected during calibration cycles may be utilized to determine one or more transfer functions that are in turn utilized to determine signal filtering and signal cancellation parameters. A calibration cycle may include controller 235 and/or other processing components determining values for a first transfer function that associates a back side acoustic response detected by the secondary transducer to an input excitation signal applied to the primary transducer. Controller 235 and/or other processing components may be further configured to determine values for a second transfer function that associates the acoustic response detected by the primary transducer to an input excitation signal applied to the secondary transducer. Values for a third transfer function may be determined by controller 235 and/or other processing components based, at least in part, on the first and second transfer function values and on other acoustic propagation and reflection parameters.

In some embodiments, controller 235 and/or other processing components generate an interference signal profile based on and in part by the determinations of the first, second, and third transfer function values. Generating the interference signal profile may further include determining an interference response of the primary transducer to reflected components of back side acoustic waves. In such embodiments, self-induced acoustic noise may be removed from detected echo responses using the determined interference response. For example, controller 235 may receive a detected echo response from the primary transducer during a measurement cycle and remove from the response signal components corresponding to the interference response. In some embodiments, the interference response may be used to determine a control signal applied to the secondary transducer during measurement cycles to actively cancel the back side acoustic waves.

In some embodiments, controller 235 and/or other processing components are configured to actively cancel back side acoustic waves using differences in signal metrics between a calibration response of the secondary transducer and a corresponding excitation of the primary transducer. For example, controller 235 may detect the excitation signal and corresponding back side calibration response signal and measure or otherwise determine a phase offset, an amplitude difference, and/or a frequency shift between the signals. Controller 235 and/or other electronics are configured to process the detected signal metrics and differences between the signal metrics to generate a cancellation factor comprising phase, amplitude, and/or frequency components. A control signal is generated by modifying a measurement cycle excitation signal in accordance with the cancellation factor and applied to the secondary transducer during measurement cycles to actively cancel back side acoustic waves.

Figure 3:
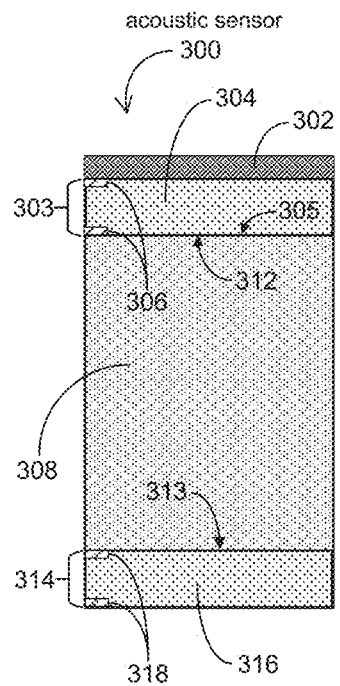
FIG. 3 is a cross-section diagram depicting components of a piezoelectric acoustic sensor in accordance with some embodiments.
Figure 4:
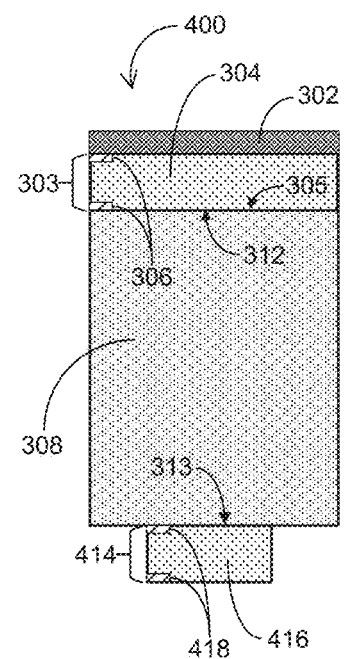
FIG. 4 is a cross-section diagram illustrating components of a piezoelectric acoustic sensor in accordance with some embodiments.
Figure 5:
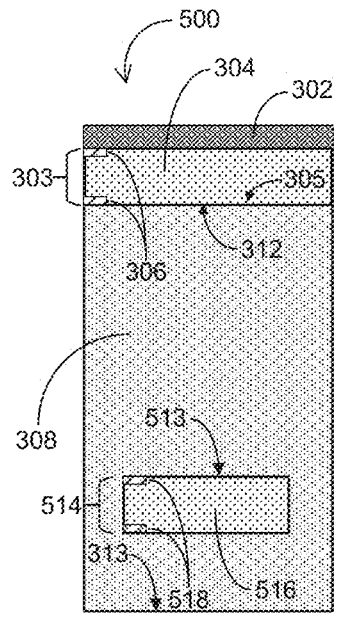
FIG. 5 is a cross-section diagram depicting components of a piezoelectric acoustic sensor in accordance with some embodiments.

As depicted and described with reference to FIGS. 3-5, different dual-transducer acoustic sensor configurations may be utilized depending on the application and the operational context. FIG. 3 illustrates a cross-section view of an acoustic sensor 300 that may be implemented within an acoustic tool such as acoustic logging tool 200. Acoustic sensor 300 includes a primary piezoelectric transducer 303 and a secondary piezoelectric transducer 314. At a sensor front side from which acoustic pulses are transmitted during measurement cycles, acoustic sensor 300 includes a cover layer 302 attached to a front side of primary transducer 303. Cover layer 302 is configured to implement a protection function by providing a fluid impermeable barrier as well as an impedance matching function. Cover layer 302 may comprise, in part, an epoxy resin material having an intermediate acoustic impedance relative to the high acoustic impedance of piezoelectric crystal material and the low acoustic impedance of a wellbore environment that typically comprises a combination of drilling fluid and water. In some embodiments, cover layer 302 may comprise material having an acoustic impedance substantially matching an acoustic impedance of a downhole fluid environment that provides the external acoustic medium through which the acoustic pulses are transmitted.

Primary transducer 303 comprises a piezoelectric layer 304 and a pair of electrodes 306 coupled across a width dimension of piezoelectric layer 304. Secondary transducer 314 comprises a piezoelectric layer 316 and a pair of electrodes 318 coupled across a width dimension of piezoelectric layer 316. Each of piezoelectric layers 304 and 316 may be fabricated of a piezoelectric crystal and/or ceramic material or combination of such materials. Attached to a back side 305 of piezoelectric layer 304 between primary transducer 303 and secondary transducer 314 is a backing material layer 308 comprising acoustic damping material such as tungsten rubber. Backing material layer 308 is depicted as a block component having a front side 312 attached to or otherwise contacting the back side 305 of piezoelectric layer 304. Back side acoustic waves generated during an excitation pulse phase propagate from back side 305 into backing material layer 308 toward a back side 313 of backing material layer 308 that is attached or otherwise contacting a front side of piezoelectric layer 316.

Alternate embodiments may utilize acoustic sensors having secondary transducers that are differently structured and/or are positioned differently with respect to the backing material layer. In FIG. 3, for example, secondary transducer 314 is disposed at and extends substantially the full length of the back side 313 of backing material layer 308. FIG. 4 depicts an acoustic sensor 400 that is configured similarly to acoustic sensor 300 except for the disposition of a secondary transducer 414 with respect to backing material layer 308. Similar to secondary transducer 314, secondary transducer 414 comprises a piezoelectric layer 416 and a pair of electrodes 418 coupled across a width dimension of piezoelectric layer 416. Secondary transducer 414 is also similarly disposed substantially at the acoustic boundary formed at the back side 313 of acoustic sensor 400. In contrast to secondary transducer 314, secondary transducer 414 is sized so that it spans a portion of but not the entire area of the back side 313 of acoustic sensor 400. FIG. 5 depicts an acoustic sensor 500 that is also configured similarly to acoustic sensor 300 except for the disposition of a secondary transducer 514 with respect to backing material layer 308. Similar to secondary transducer 314, secondary transducer 514 comprises a piezoelectric layer 516 and a pair of electrodes 518 coupled across a width dimension of piezoelectric layer 516. Unlike secondary transducers 314 and 414, secondary transducer 514 is not disposed substantially at the acoustic boundary formed at the acoustic sensor back side 313. Instead, secondary transducer 414 is embedded within backing material layer 308 so that it is between the front side 312 and the back side 313 of backing material layer 308.

Figure 6:
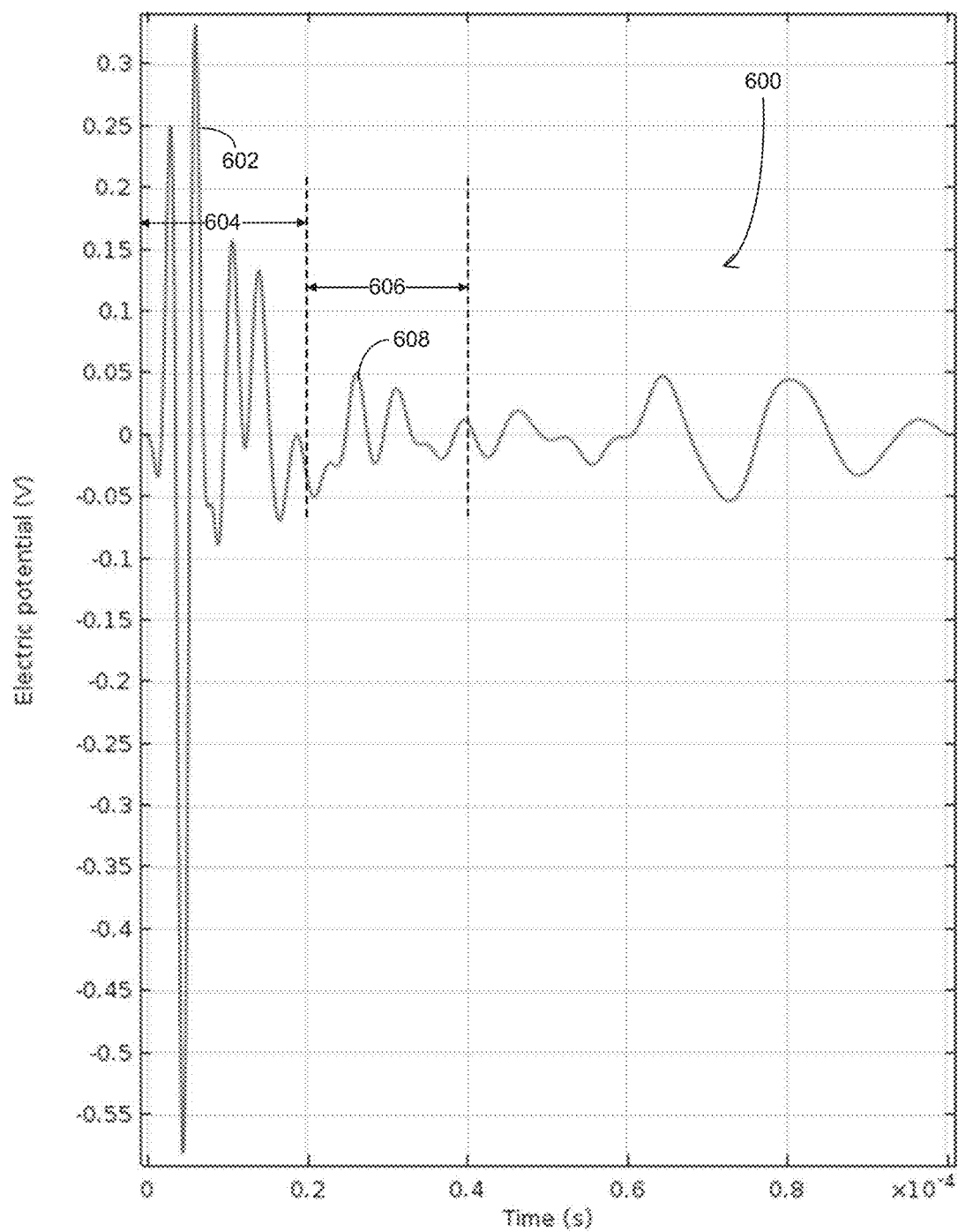
FIG. 6 is a signal diagram illustrating an acoustic sensor signal profile in which echo response signal components are distorted by internal acoustic reflection components.

Referring to FIG. 6 in conjunction with FIG. 2B, an acoustic sensor signal profile 600 is depicted in which echo response signal components are distorted by internal acoustic reflection components. Signal profile 600 includes signal components of an excitation pulse 602 that are generated and applied to a primary transducer during an excitation phase 604 of a measurement cycle. For example, with excitation pulse 602 applied to the primary transducer within acoustic sensor 220 in FIG. 2B, piezoelectric layer 221 reacts by converting the excitation pulse 602 into corresponding ultrasonic acoustic waves. The acoustic waves are transmitted radially outward through cover layer 223 as sensor pulse 238. The induced acoustic waves further include back side acoustic waves transmitted into backing material layer 308 toward back side 246.

Subsequent to an excitation phase, each acoustic logging measurement cycle includes a corresponding echo response phase during which the sensor and electronics components of a primary transducer are in acoustic receiving mode to detect an acoustic echo. As shown in FIG. 6, excitation phase 604 is followed by an echo response phase 606 during which the primary transducer and other sensor components operate in acoustic detection mode. During echo response phase 606, the primary transducer generates response signal components 608 in response to reverberations induced by the intended echo response (e.g., echo signal 240) in combination with reverberations induced back side acoustic interference. The detected response signal 608 may comprise electrical signal components corresponding to echo response 240 that are combined with and therefore distorted by electrical signal components corresponding to reverberations induced in piezoelectric layer 221 by backside reflected waves 256.

Figure 7:
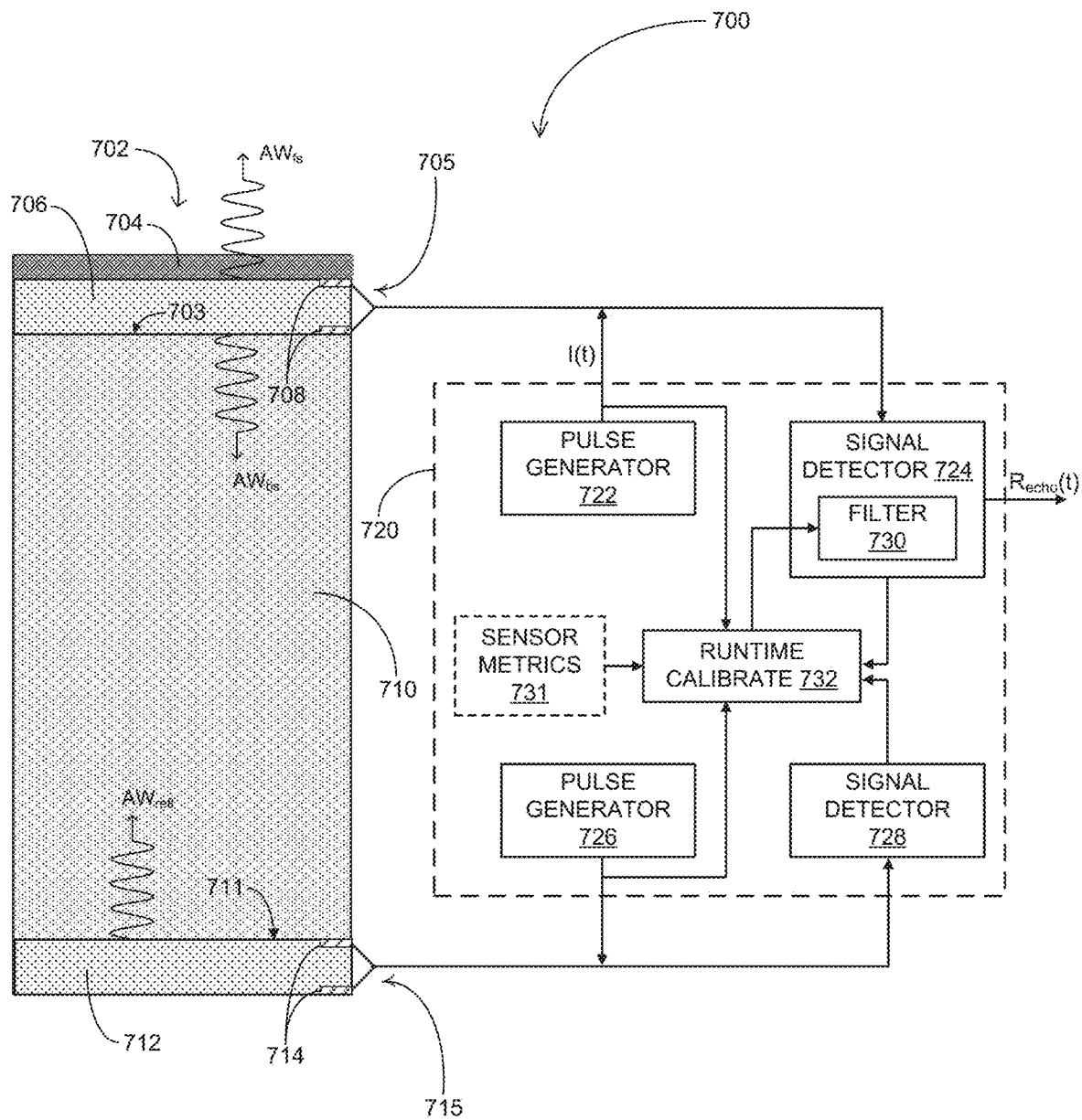
FIG. 7 is a partial cross-section diagram illustrating an acoustic sensor system configured to adaptively remove internal reflection components from an echo response signal in accordance with some embodiments.

FIG. 7 illustrates an acoustic sensor system 700 configured to adaptively remove internal reflection components from a sensor response signal in accordance with some embodiments. The components, devices, systems, operations, and functions described with reference to acoustic sensor system 700 may be included in or implemented by the acoustic sensor components depicted and described with reference to FIGS. 1, 2A, 2B, 3, 4, and 5. Acoustic sensor system 700 includes a piezoelectric acoustic sensor 702 coupled to a controller 720. Acoustic sensor 702 may be implemented within an acoustic logging tool such as acoustic tool 200 and comprises a primary piezoelectric transducer 705 and a secondary piezoelectric transducer 715. At a front side from which front side acoustic waves $AW_{fs}$ are transmitted as senor pulses during measurement cycles, acoustic sensor 702 includes a cover layer 704. Cover layer 704 is attached to a front side of primary transducer 705 and is configured with the same or similar characteristics as described for the cover layers depicted in FIGS. 2B, 3, 4, and 5.

Primary transducer 705 comprises a piezoelectric layer 706 and a pair of electrodes 708 coupled across a width dimension of piezoelectric layer 706. Secondary transducer 715 comprises a piezoelectric layer 712 and a pair of electrodes 714 coupled across a width dimension of piezoelectric layer 712. Attached to or otherwise contacting a back side 703 of primary transducer 705 between primary transducer 705 and secondary transducer 715 is a backing material layer 710 comprising acoustic damping material such as tungsten rubber. Back side acoustic waves $AW_{bs}$ generated during an excitation input phase propagate from back side 703 into backing material layer 710 toward a back side 711 of backing material layer 710 that is attached or otherwise contacting a front side of secondary transducer 715. The back side acoustic waves $AW_{bs}$ reflect from back 711 as reflected acoustic waves $AW_{refl}$.

Controller 720 is configured to implement acoustic logging in a manner that reduces or removes the self-induced interference caused by reflected acoustic waves $AW_{refl}$. The components, operations, and functions described with reference to controller 720 may be included in and/or implemented by the controller 235 depicted in FIG. 2B. Controller 720 includes signal generator components including a pulse generator 722 coupled to primary transducer 705 and a pulse generator 726 coupled to secondary transducer 715. While depicted as separate entities in the block diagram representation, the components, operations, and functions of pulse generators 722 and 726 may be integrated into a single pulse generator device. Pulse generators 722 and 726 are configured, using any combination of electronics and programmed components, to generate and apply electrical excitation pulses to primary transducer 705 and secondary transducer 715, respectively.

Controller 720 further includes signal processor components including a signal detector 724 coupled to and receiving input from primary transducer 705 and a signal detector 728 coupled to and receiving input from secondary transducer 715. While depicted as separate entities in the block diagram representation, the components, operations, and functions of signal detectors 724 and 728 may be integrated into a single detector device. Signal detectors 724 and 728 are configured, using any combination of electronics and programmed components, to detect electrical responses generated by primary transducer 705 and secondary transducer 715, respectively, in response to received acoustic waves. The received acoustic waves include echo signals and other acoustic signals received during measurement and calibration cycles. During calibration cycles, the received acoustic waves also include back side waves $AW_{bs}$ received by secondary transducer 715 and acoustic waves generated by secondary transducer 715 and received by primary transducer 705.

Controller 720 is configured to implement measurement cycles each including an excitation phase during which pulse generator 722 excites primary transducer 705 resulting in transmission of the front side acoustic waves $AW_{fs}$ and incidentally inducing the back side acoustic waves $AW_{bs}$. Following the excitation phase, a measurement cycle continues with controller 720 implementing an echo response phase during which signal detector 724 receives and detects an echo response signal generated by primary transducer 705. As described with reference to FIG. 6, signal detector 724 also receives and detects interference signal components in the form of the reflected back side acoustic waves $AW_{refl}$ during the echo response phase that may result in distortion of the output echo response signal. To eliminate or reduce the distortion, the interference signal components are removed by a filter 730 within signal detector 724. Filter 730 may be configured as a programmed electronics component to remove interference components $R_i(t)$ from the overall signal components $R_T(t)$ received during an echo response phase. For example, filter 730 may be configured to remove components having one or more frequencies or frequency bands corresponding to frequency and frequency bands of the interference components $R_i(t)$.

Controller 720 further includes a calibration unit 732 configured to generate an interference signal profile and to generate filter parameters (e.g., frequencies to be removed) for filter 730 from the interference signal profile. The interference signal profile and corresponding filter parameters are set and may be reset during calibration cycles executed periodically between one or more measurement cycles. An interference signal profile may comprise various calibration response parameters, such as transfer function values, that relate calibration responses of either or both primary and secondary transducers 705 and 715 with corresponding excitations signals applied to transducers 705 and 715. The interference signal profile may further include correlation parameters, such as correlation transfer function values, that correlate the calibration response of primary transducer 705 with the calibration response of secondary transducer 715. Calibration unit 732 is configured to determine an interference response $R_i(t)$ of the primary transducer to reflected back side acoustic waves based on the correlation transfer function values and the parameters of the excitation signal for primary transducer 705. Calibration unit 732 is further configured to determine filtration parameters for filter 730 based on signal characteristics of the interference response.

In some embodiments, a calibration cycle includes primary transducer 705 generating acoustic waves including back side acoustic waves $AW_{bs}$ in response to an excitation signal I(t) applied by pulse generator 722. Detector 728 measures or otherwise detects a calibration response signal M(t) generated by secondary transducer 715 in response to back side acoustic waves $AW_{bs}$. Calibration unit 732 is communicatively coupled with pulse generator 722 and detector 728 to receive excitation signal I(t) from pulse generator 722 and response signals, such as M(t), from detector 728. Calibration unit 732 is configured to determine values for the first transfer function based on M(t) and I(t). In some embodiments, the values of the first transfer function $T_{IM}$ are calculated in accordance with the relation $T_{IM}=M(t)./I(t)$, in which ./ represents a deconvolution operation.

The calibration cycle may further include secondary transducer 715 generating acoustic waves into backing material layer 710 in response to an excitation signal MI(t) applied to secondary transducer 715 by pulse generator 726.

Detector 724 measures or otherwise detects a second calibration response signal RI(t) generated by primary transducer 705 in response to the acoustic waves generated by secondary transducer 715. Calibration unit 732 is communicatively coupled with pulse generator 726 and detector 724 to receive excitation signal MI(t) from pulse generator 726 and response signals, such as RI(t), from detector 724. Calibration unit 732 is configured to determine values for the second transfer function based on RI(t) and MI(t). In some embodiments, the values of the second transfer function $T_{CR}$ are calculated in accordance with the relation $T_{CR}$=RI(t)./MI(t), in which ./ represents a deconvolution operation.

Calibration unit 732 is further configured to determine the correlation parameters based on acoustic propagation and reflection metrics of the sensor as well as the first and second calibration responses. In the depicted embodiment, calibration unit 732 receives information from one or more sources relating to sensor metrics that may affect the acoustic performance of components within acoustic sensor 702. For example, sensor metrics 731 may be received and processed by calibration unit 732. In some embodiments, sensor metrics 731 include measurable or otherwise determinable acoustic performance properties such as acoustic propagation and reflection based on material properties that remain relatively constant under differing environmental conditions such as temperature and pressure. Sensor metrics 731 may include, for example, performance metrics such as the electric-to-acoustic conversion efficiency, $T_{t2}$, of secondary transducer 715 and the acoustic-to-electric conversion efficiency, $T_{r2}$, of secondary transducer 715. Sensor metrics 731 may also include a reflection efficiency, $T_R$, of the back side 711 of backing material layer 710 that forms an acoustic boundary from which back side acoustic waves are reflected.

The correlation parameters determined by calibration unit 732 may include values for a third transfer function that is based on the first and second transfer functions as well as one or more of sensor metrics 731. In some embodiments, the third transfer function $T_{IR}$ is calculated in accordance with the relation $T_{IR}=T_{IM}.*T_{CR}.*T_R./T_{r2}./T_{t2}$, in which .* represents a convolution operation and ./ represents a deconvolution operation. Calibration unit 732 is further configured to determine interference signal components based on the third transfer function and the primary transducer excitation signal I(t). In some embodiments, an interference signal, $R_i(t)$, is determined in accordance with the relation $R_i(t)$=I(t).*$T_{IR}$. The interference signal represents signal components generated by primary transducer 705 in response to the reflected back side acoustic waves $AW_{refl}$. In the foregoing manner, the interference signal profile comprises one or more of the first, second, and third transfer function values and/or one or more of sensor metrics 731 that are utilized to generate the components (e.g., frequencies) of interference signal $R_i(t)$ utilized to configure filter 730. For example, a signal $R_T$ detected by detector 724 during the response phase of a measurement cycle includes self-induced reflection interference components $R_i$ as well as echo response components $R_{echo}$ and may be characterized as $R_T(t)=R_{echo}(t)+R_i(t)$. Filter 730 may be programmatically configured based on the interference signal profile received from calibration module 732 to selectively remove signal components corresponding to the interference signal $R_i(t)$.

Figure 8:
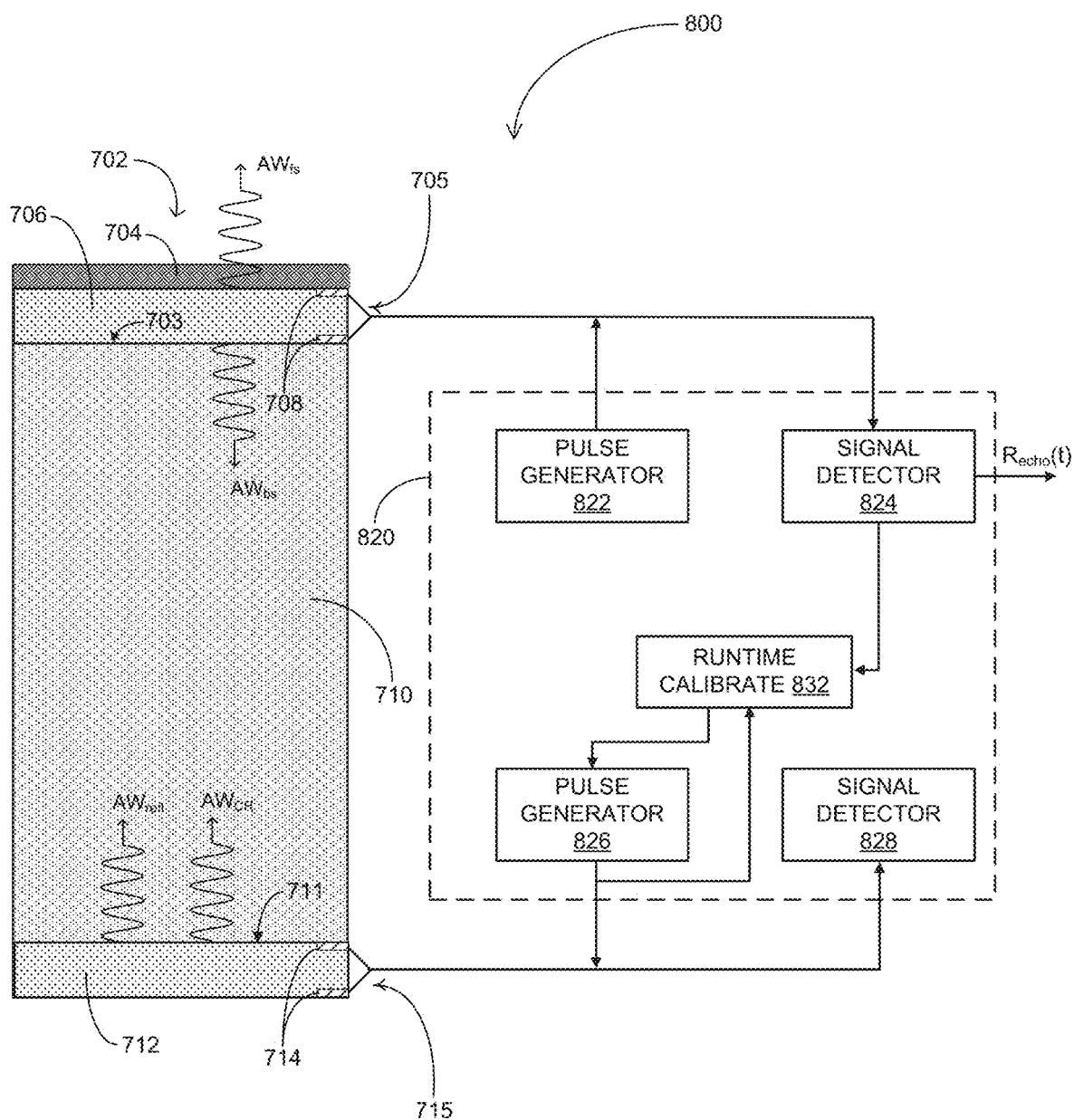
FIG. 8 is a partial cross-section diagram depicting an acoustic sensor system configured to prevent distortion by internal reflection components by adaptively canceling back side acoustic waves in accordance with some embodiments.

FIG. 8 depicts an acoustic sensor system 800 configured to prevent distortion by internal reflection components by adaptively canceling back side acoustic waves in accordance with some embodiments. The components, devices, systems, operations, and functions described with reference to acoustic sensor system 800 may be included in or implemented by the acoustic sensor components depicted and described with reference to FIGS. 1, 2A, 2B, 3, 4, 5, and 7. Like acoustic sensor system 700, system 800 includes piezoelectric acoustic sensor 702 comprising the various components and features depicted and described with reference to FIG. 7. Piezoelectric acoustic sensor 702 is coupled to a controller 820 that like controller 720 is configured to execute measurement cycles in which acoustic logging data is collected and calibration cycles in which calibration information is generated to reduce self-induced acoustic interference.

Controller 820 includes signal generator components including a pulse generator 822 coupled to primary transducer 705 and a pulse generator 826 coupled to secondary transducer 715. While depicted as separate entities in the block diagram representation, the components, operations, and functions of pulse generators 822 and 826 may be integrated into a single pulse generator device. Pulse generators 822 and 826 are configured, using any combination of electronics and programmed components, to generate and apply electrical excitation pulses to primary transducer 705 and secondary transducer 715, respectively.

Controller 820 further includes signal processor components including a signal detector 824 coupled to and receiving input from primary transducer 705 and a signal detector 828 coupled to and receiving input from secondary transducer 715. While depicted as separate entities in the block diagram representation, the components, operations, and functions of signal detectors 824 and 828 may be integrated into a single detector device. Signal detectors 824 and 828 are configured, using any combination of electronics and programmed components, to detect electrical responses generated by primary transducer 705 and secondary transducer 715, respectively, in response to received acoustic waves. The received acoustic waves include echo response signals and other acoustic signals received during measurement and calibration cycles. During calibration cycles, the received acoustic waves also include back side waves $AW_{bs}$ received by secondary transducer 715 and reflected back side waves $AW_{refl}$ received by primary transducer 705.

Controller 820 is configured to implement measurement cycles each including an excitation phase during which pulse generator 822 excites primary transducer 705 resulting in transmission of the front side acoustic waves $AW_{fs}$ and incidentally inducing the back side acoustic waves $AW_{bs}$. Following the excitation phase, a measurement cycle continues with controller 820 implementing an echo response phase during which signal detector 824 receives and detects an echo response signal generated by primary transducer 705. As depicted and described with reference to FIG. 6, if the reflected back side acoustic waves $AW_{refl}$ are received by signal detector 824, the resultant interference may distort the output detected during the echo response phase. To eliminate or reduce distortion of the echo response signal, controller 820 is configured to implement an active and adaptive cancellation procedure for reducing or eliminating the back side acoustic waves prior to reaching and being reflected by the back side 711 of backing material layer 710.

Controller 820 further includes a calibration unit 832 that is configured to generate an interference signal profile that is used to determine signal parameters such as frequency, amplitude, and phase of a control signal, CR(t). During measurement cycles, pulse generator 826 generates and applies control signal CR(t) as excitation for secondary transducer 715 to generate cancellation acoustic waves, $AW_{CR}$, that at least partially cancel the back side waves $AW_{bs}$. The interference signal profile and corresponding control signal parameters are set and may be reset during calibration cycles executed periodically between one or more measurement cycles. The interference signal profile may comprise various calibration response parameters, such as transfer function values, that relate calibration responses of either or both primary and secondary transducers 705 and 715 with corresponding excitations signals applied to the transducers. The interference signal profile may further include correlation parameters, such as correlation transfer function values, that correlate the calibration response of primary transducer 705 with the calibration response of secondary transducer 715. Calibration unit 832 is configured to determine a transfer function $T_{CR}$ based on the secondary transducer excitation signal MI(t) and the corresponding calibration response RI(t) of the primary transducer to MI(t). Calibration unit 832 is further configured to determine a response R(t) generated by primary transducer 705 in response to excitation I(t) applied to primary transducer 705. Calibration unit 832 is configured to determine the signal parameters of a control signal, CR(t), based at least in part, on $T_{CR}$ and R(t). During measurement cycles, pulse generator 826 generates and applies CR(t) as excitation to secondary transducer 715 to generate the cancellation acoustic waves, $AW_{CR}$, that fully or partially cancel the back side waves $AW_{bs}$.

During a calibration cycle, primary transducer 705 generates acoustic waves including back side acoustic waves $AW_{bs}$ in response to an excitation signal I(t) applied by pulse generator 822. Detector 824 measures or otherwise detects a calibration response signal R(t) generated by primary transducer 705 in response to various signal components induced by I(t) such as echo response signals and back side acoustic waves $AW_{bs}$. Calibration unit 832 is communicatively coupled with pulse generator 822 and detector 824 to receive excitation signal I(t) from pulse generator 822 and response signals, such as calibration response R(t), from detector 824. The calibration cycle may further include secondary transducer 715 generating acoustic waves into backing material layer 710 in response to an excitation signal MI(t) applied by pulse generator 826. Detector 824 measures or otherwise detects a calibration response signal RI(t) generated by primary transducer 705 in response to the acoustic waves generated by secondary transducer 715. Calibration unit 732 is communicatively coupled with pulse generator 826 and detector 824 to receive excitation signal MI(t) from pulse generator 826 and response signals, such as calibration response RI(t) from detector 824.

Calibration unit 832 is configured to determine values for the second transfer function based on RI(t) and MI(t). In some embodiments, the values of the second transfer function $T_{CR}$ are calculated in accordance with the relation $T_{CR}$=RI(t)./MI(t). Calibration unit 832 determines the control signal CR(t) based on R(t) in combination with $T_{CR}$. For example, calibration unit 832 may determine the parameters for CR(t) in accordance with the relation: CR(t)=−R(t)./$T_{CR}$, in which ./ represents a deconvolution operation. Pulse generator 826 receives the parameters from calibration unit 832 and generates the control signal CR(t) during measurement cycles to partially or fully cancel the back side acoustic waves that would otherwise cause internal reflection interference during a measurement cycle response phase.

Figure 9A:
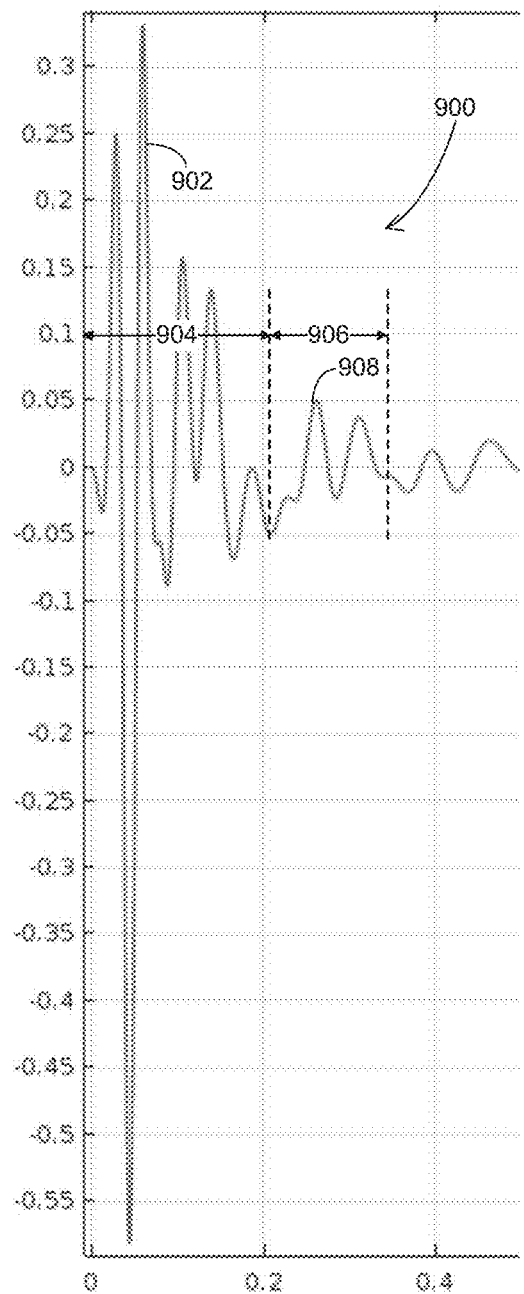
FIG. 9A is a signal diagram depicting an acoustic sensor signal profile for a measurement cycle that includes internal acoustic reflection distortion.

FIG. 9A depicts an acoustic sensor signal profile 900 for a measurement cycle that includes internal acoustic reflection distortion. Signal profile 900 includes signal components of an excitation pulse 902 that may be applied to primary transducer 705 during an excitation phase 904 of a measurement cycle. Primary transducer 705 responds by converting the excitation pulse 902 into corresponding front side and back side ultrasonic acoustic waves. The back side acoustic waves induced by primary transducer 705 propagate through backing material layer 710 and reflect from back side 711. Following excitation phase 904 and during an echo response phase 906 of the measurement cycle, a response signal 908 is detected that includes echo response components and reflected components of the back side acoustic waves that distort the echo response.

Figure 9B:
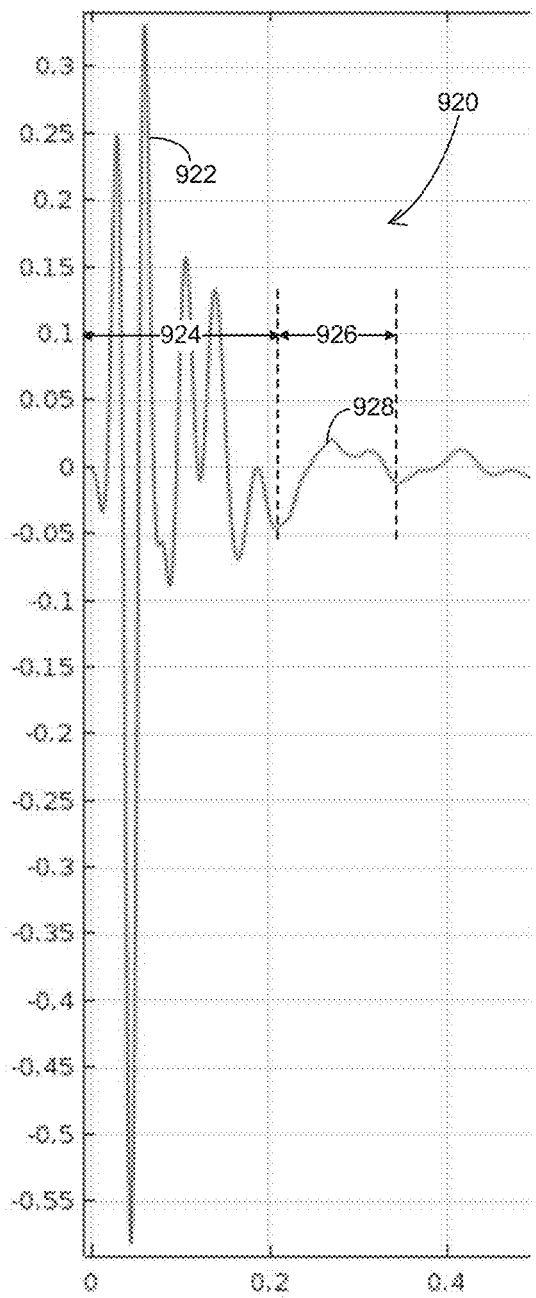
FIG. 9B is a signal diagram illustrating an acoustic sensor signal profile for a measurement cycle in which adaptive acoustic cancellation is implemented in accordance with some embodiments.

FIG. 9B illustrates an acoustic sensor signal profile 920 for a measurement cycle in which adaptive acoustic cancellation is implemented by acoustic sensor system 800 in accordance with some embodiments. Signal profile 920 includes signal components of an excitation pulse 922 applied to primary transducer 705 during an excitation phase 924 of the measurement cycle. Primary transducer 705 responds by converting excitation pulse 922 into corresponding front side and back side ultrasonic acoustic waves. Also during at least a portion of excitation phase 922, a control excitation signal is applied to secondary transducer 715, inducing cancellation acoustic waves AWCR that propagate within backing material layer 710 at least partially cancelling the back side signal components from primary transducer 705. As a result, an echo response signal 928 detected during the echo response phase 926 is relatively free of internal reflection interference.

Figure 10:
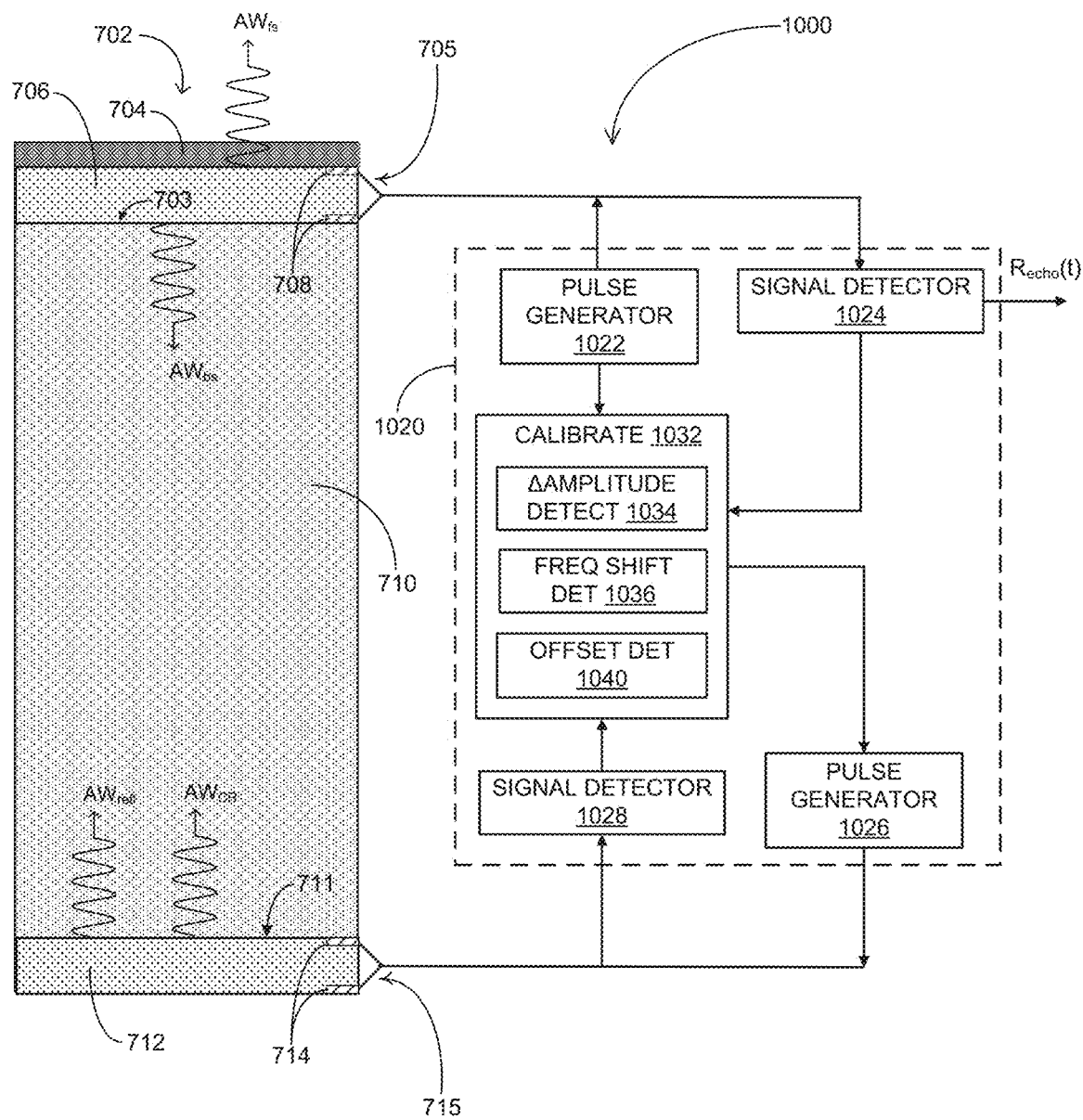
FIG. 10 is a partial cross-section diagram depicting an acoustic sensor system configured to prevent distortion by internal reflection components by adaptively canceling back side acoustic waves in accordance with some embodiments.

FIG. 10 depicts an acoustic sensor system 1000 configured to prevent distortion by internal reflection components by adaptively canceling back side acoustic waves in accordance with some embodiments. The components, devices, systems, operations, and functions described with reference to acoustic sensor system 1000 may be included in or implemented by the acoustic sensor components depicted and described with reference to FIGS. 1, 2A, 2B, 3, 4, 5, 7, and 8. Like acoustic sensor systems 700 and 800, acoustic sensor system 1000 includes piezoelectric acoustic sensor 702 comprising the various components and features depicted and described with reference to FIG. 7. Piezoelectric acoustic sensor 702 is coupled to a controller 1020 that is configured to execute measurement cycles in which acoustic logging data is collected and calibration cycles in which calibration information is generated to mitigate self-induced acoustic interference.

Controller 1020 includes signal generator components including a pulse generator 1022 coupled to primary transducer 705 and a pulse generator 1026 coupled to secondary transducer 715. While depicted as separate entities in the block diagram representation, the components, operations, and functions of pulse generators 1022 and 1026 may be integrated into a single pulse generator device. Pulse generators 1022 and 1026 are configured, using any combination of electronics and programmed components, to generate and apply electrical excitation pulses to primary transducer 705 and secondary transducer 715, respectively.

Controller 1020 further includes signal processor components including a signal detector 1024 coupled to and receiving input from primary transducer 705 and a signal detector 1028 coupled to and receiving input from secondary transducer 715. While depicted as separate entities in the block diagram representation, the components, operations, and functions of signal detectors 1024 and 1028 may be integrated into a single detector device. Signal detectors 1024 and 1028 are configured, using any combination of electronics and programmed components, to detect electrical responses generated by primary transducer 705 and secondary transducer 715, respectively, in response to received acoustic waves. The received acoustic waves include echo response signals and other acoustic signals received during measurement and calibration cycles. During calibration cycles, the received acoustic waves also include back side waves $AW_{bs}$ received by secondary transducer 715 and acoustic waves generated by secondary transducer 715 and received by primary transducer 705.

Controller 1020 is configured to implement measurement cycles each including an excitation phase during which pulse generator 1022 excites primary transducer 705 resulting in transmission of the front side acoustic waves $AW_{fs}$ and incidentally inducing the back side acoustic waves $AW_{bs}$. Following the excitation phase, the measurement cycle continues with controller 1020 implementing an echo response phase during which signal detector 1024 detects an echo response signal generated by primary transducer 705. As depicted and described with reference to FIG. 6, if the reflected back side acoustic waves $AW_{refl}$ are received by signal detector 1024, the resultant interference may distort the output detected during the echo response phase. To eliminate or reduce distortion of the echo response signal, controller 1020 is configured to implement an active and adaptive cancellation procedure for reducing or eliminating the back side acoustic waves prior to reaching and being reflected by the back side 711 of backing material layer 710.

Controller 1020 further includes a calibration unit 1032 configured to generate an interference signal profile that includes and/or is used to determine signal parameters such as frequency, amplitude, and phase of a control signal CR(t). During measurement cycles, pulse generator 1026 generates and applies control signal CR(t) as excitation input to secondary transducer 715 to generate cancellation acoustic waves, $AW_{CR}$, that at least partially cancel the back side waves $AW_{bs}$. The interference signal profile and corresponding control signal parameters are set and may be reset during calibration cycles executed periodically between one or more measurement cycles.

The interference signal profile may comprise various calibration response parameters, such as signal metrics for excitation signals, transducer response signals, and differences between the signal metrics. For example, the interference signal profile may include a phase offset between a calibration response and a corresponding excitation signal and an amplitude difference between the calibration response and a reflected back side acoustic wave response of the primary transducer. The interference signal profile includes and/or is utilized to generate signal parameters of control signal CR(t). During measurement cycles, pulse generator 1026 generates and applies CR(t) as excitation to secondary transducer 715 to generate the cancellation acoustic waves, $AW_{CR}$, that fully or partially cancel the back side waves $AW_{bs}$.

The parameters for CR(t) such as phase, frequency, and/or amplitude, are determined based on interference signal profiles that are generated during calibration cycles. During a calibration cycle, primary transducer 705 generates acoustic waves including back side acoustic waves $AW_{bs}$ in response to an excitation signal I(t) applied to primary transducer 705. Detector 1028 measures or otherwise detects a calibration response signal M(t) generated by secondary transducer 715 in response to the back side acoustic waves. Calibration unit 1032 is communicatively coupled to receive signal and/or data inputs from pulse generator 1022 and signal detectors 1024 and 1028. Calibration unit 1032 includes components including an amplitude difference detector 1034, a frequency shift detector 1036, and a phase offset detector 1040 that are configured to determine signal metrics and differences in the metrics. The determined metrics are utilized by calibration unit 1032 to determine signal interference profiles and corresponding control signal metrics for calibrating pulse generator 1026.

Calibration unit 1032 receives calibration response signal M(t) and/or metrics of M(t) from signal detector 1028 and receives response signals from signal detector 1024. Amplitude difference detector 1034 is configured to receive or otherwise determine an amplitude for M(t) based on the input from signal detector 1028. Amplitude difference detector 1034 further receives or otherwise determines an amplitude for a response of primary transducer 705 to reflected back side acoustic waves based on input from signal detector 1024. Amplitude difference detector 1034 is further configured to determine a difference, in terms of amplitude ratio, amplitude differential value, or otherwise between calibration response M(t) and the reflected back side acoustic response of primary transducer 705 detected by detector 1024 in response to $AW_{refl}$.

In addition to the inputs from signal detectors 1024 and 1028, calibration unit 1032 is configured to receive primary transducer excitation signal I(t) or signal metric information for I(t) from pulse generator 1022. Frequency shift detector 1036 is configured to determine a frequency shift between I(t) and M(t). Phase offset detector 1040 is configured to detect, measure, or otherwise determine the phase offset between the excitation signal I(t) and the corresponding calibration response M(t). Calibration unit 1032 is further configured to process the interference signal profile comprising the amplitude difference information, phase offset information, and frequency shift information to determine signal parameters of the correction signal CR(t) are utilized by pulse generator 1026 to generate CR(t) during measurement cycles.

Figure 11:
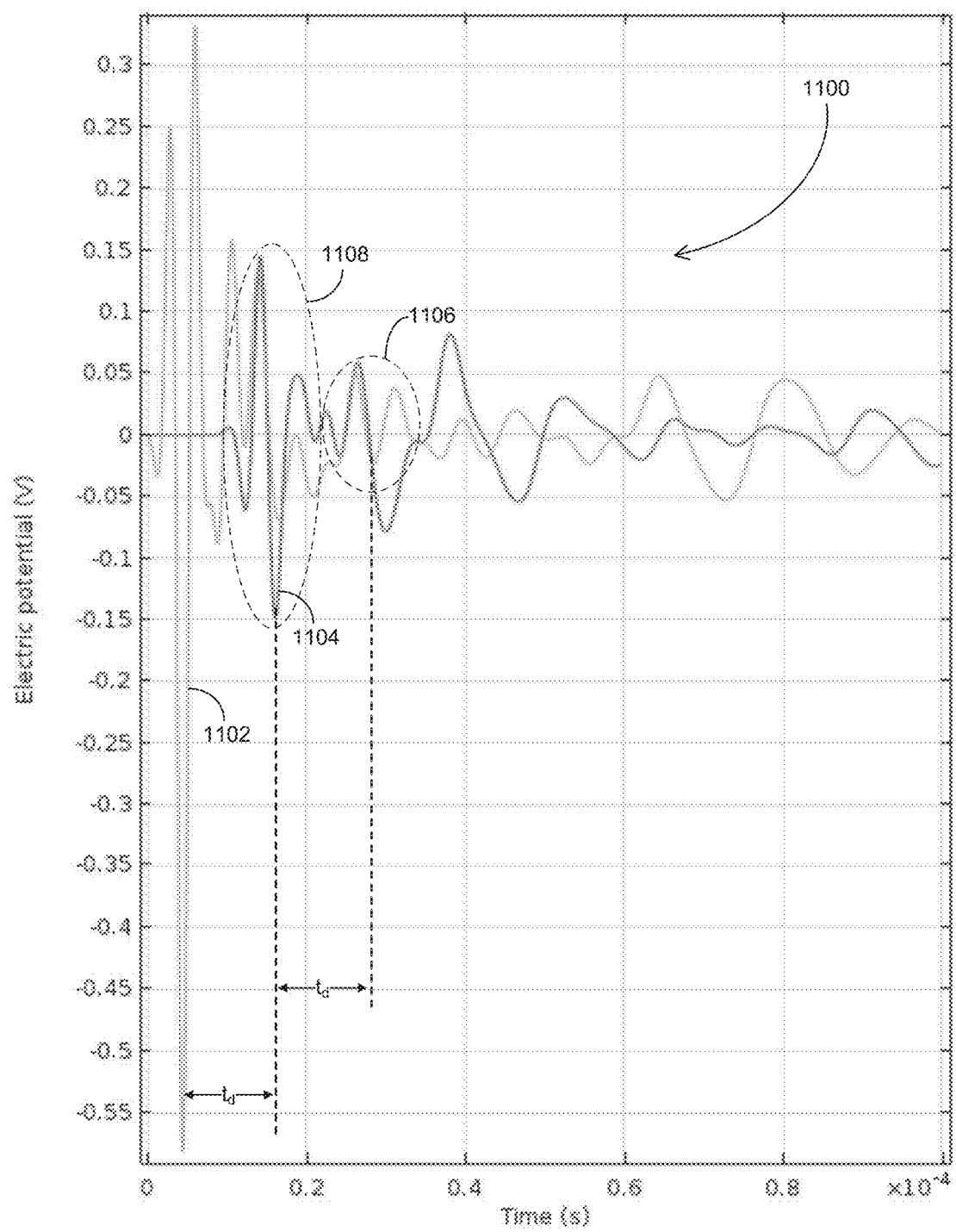
FIG. 11 is a signal diagram illustrating overlayed responses from a sensor transducer and an interference monitor transducer in accordance with some embodiments.

The calibration response M(t) of secondary transducer 715 and a response from primary transducer 705 to $AW_{refl}$ are both generated in response to the I(t) excitation signal applied to primary transducer 705 during a calibration cycle. FIG. 11 depicts overlayed calibration signal profiles 1100 that include portions of M(t), I(t), and the response to $AW_{refl}$ that are processed by components within calibration unit 1032 to generate an interference signal profile. Calibration signal response profiles 1100 includes excitation and response signal components applied to and generated by primary transducer 705 that are represented by the lighter shaded signal line. Excitation and response signal components applied to and generated by secondary transducer 715 are indicated by the darker shaded signal line.

A calibration cycle begins with an excitation signal I(t) represented by pulse 1102 inducing back side acoustic waves. In response to the back side acoustic waves, secondary transducer 715 generates a calibration response M(t) 1104 within the span of a response wavelet 1108. Offset detector 1040 determines the phase offset $t_d$ based on time difference between corresponding portions of excitation signal I(t) pulse 1102 and calibration response signal M(t) 1104. Due to relative acoustic symmetry within the sensor, the determined phase offset $t_d$ also represents the time delay for the reflected back side acoustic wave to be received by primary transducer 705. The resultant interference reverberation offset from M(t) 1104 by $t_d$ is depicted as a reverberation wavelet 1106. The known phase offset and consequently known interference components within reverberation wavelet 1106 are utilized by amplitude difference detector 1034 to determine a relative and/or absolute difference in amplitude between M(t) 1104 and reflected interference components within reverberation wavelet 1106.

In some embodiments, calibration unit 1032 generates the components of CR(t) based on a signal interference profile comprising the determined phase offset and the amplitude difference. For example, calibration unit 1032 may calculate CR(t) in accordance with the relation:

$$CR(t) = -\frac{1}{a}I((t-t_d), f_0),$$

wherein α represents a ratio of the amplitude of response wavelet 1108 to the amplitude of reverberation wavelet 1106. The CR(t) generated based on phase offset and amplitude difference may result in less than optimal reverberation reduction due to the frequency-dependent attenuation of the material within backing material layer 710. Specifically, the central frequency of the received acoustic waves may shift due to the frequency-dependent attenuation.

Calibration unit 1032 addresses potential frequency shift using the frequency shift information generated by frequency shift detector 1028. In some embodiments, frequency shift detector 1028 determines the frequency shift, fs, by comparing and determining differences in the frequency components, such as the central frequencies, of the excitation signal I(t) 1102 and the calibration response M(t) 1104. Calibration unit 1032 may therefore determine CR(t) based on the frequency shift in addition to the phase offset and amplitude difference. For example, excitation signal I(t) 1102 may be a short pulse having a center frequency $f_0$, and represented in accordance with the relation:

$$I(t) = 80\sin(2\pi f_0 t) \times \exp\left(-\left(\frac{t-\frac{1}{f_0}}{\frac{1}{2f_0}}\right)^2\right).$$

Using the frequency shift value $f_s$ in combination with the phase offset $t_d$ and amplitude difference α, calibration unit 1032 may calculate CR(t) in accordance with the relation:

$$CR(t) = -\frac{1}{a}I((t-t_d), f_0 - f_s).$$

Figure 12A:
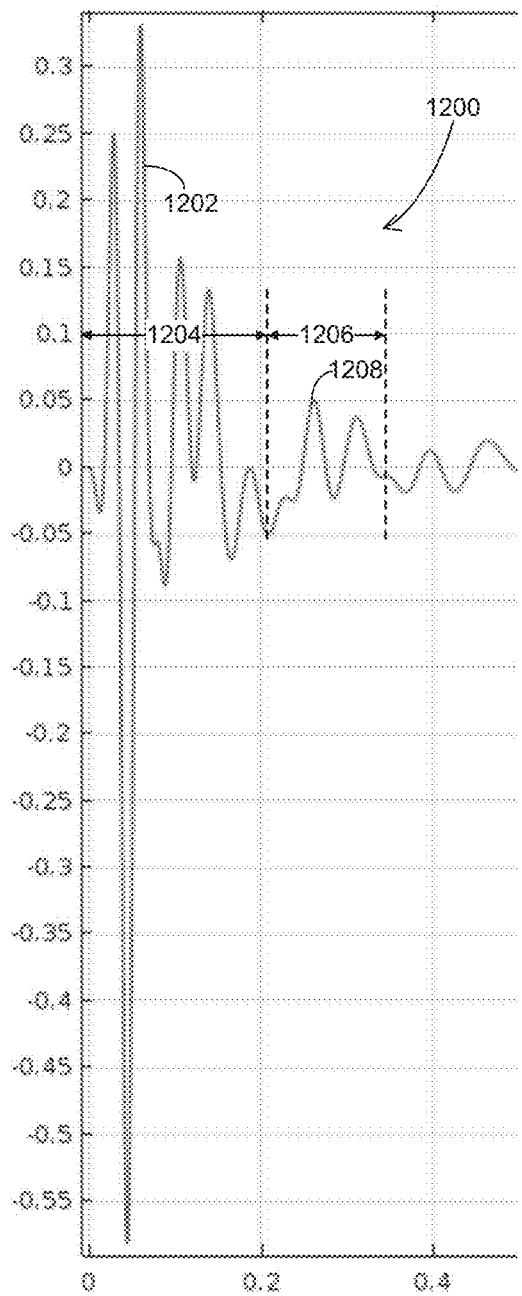
FIG. 12A is a signal diagram depicting an acoustic sensor signal profile that includes internal acoustic reflection distortion.

FIG. 12A depicts an acoustic sensor signal profile 1200 for a measurement cycle that includes internal reflection component distortion. Signal profile 1200 includes signal components of an excitation pulse 1202 that may be applied to primary transducer 705 during an excitation phase 1204 of a measurement cycle. Primary transducer 705 responds by converting the excitation pulse 1202 into corresponding front side and back side ultrasonic acoustic waves. The back side acoustic waves induced by primary transducer 705 propagate through backing material layer 710 and reflect from back side 711. Following excitation phase 1204 and during an echo response phase 1206 of the measurement cycle, a response signal 1208 is detected that includes echo response components and reflected components of the back side acoustic waves that distort the echo response.

Figure 12B:
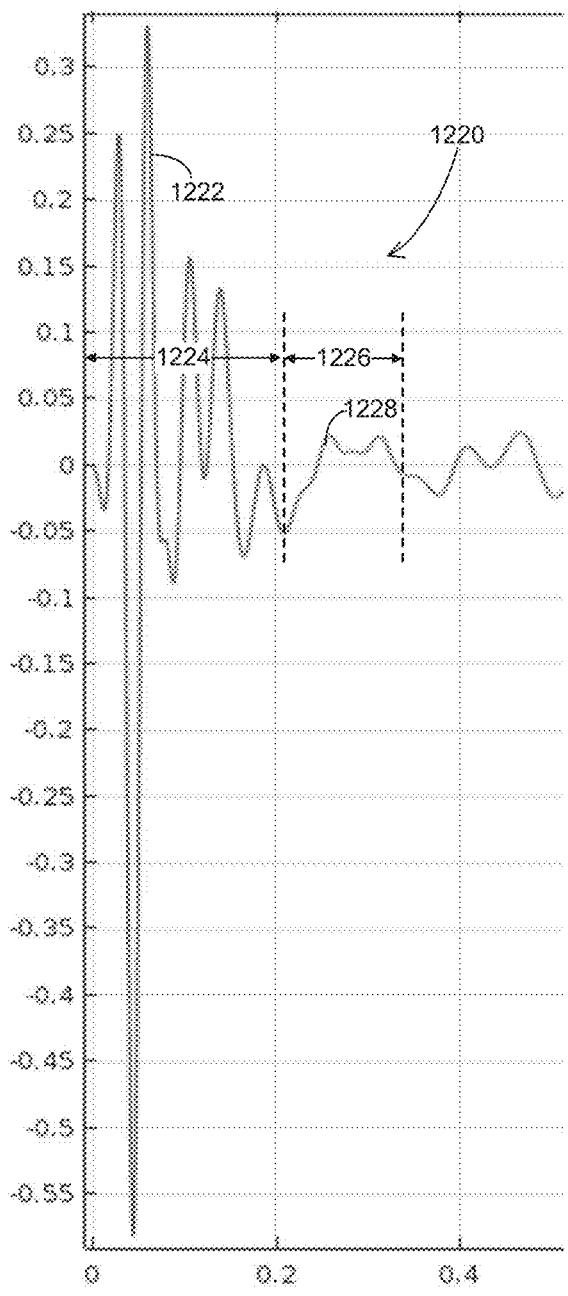
FIG. 12B is a signal diagram illustrating an acoustic sensor signal profile generated by an acoustic sensor with adaptive internal reflection cancellation in accordance with some embodiments.

FIG. 12B illustrates an acoustic sensor signal profile 1220 for a measurement cycle in which adaptive acoustic cancellation is implemented by acoustic sensor system 1000 in accordance with some embodiments. Signal profile 1220 includes signal components of an excitation pulse 1222 applied to primary transducer 705 during an excitation phase 1224 of the measurement cycle. Primary transducer 705 responds by converting excitation pulse 1222 into corresponding front side and back side ultrasonic acoustic waves. Also during at least a portion of excitation phase 1222, a control signal CR(t) is generated by pulse generator 1026 and applied to secondary transducer 715. Control signal CR(t) induces cancellation of acoustic waves AWCR that propagate within backing material layer 710 at least partially cancelling the back side signal components from primary transducer 705. As a result, an echo response signal 1228 detected during the echo response phase 1226 is relatively free of internal reflection interference.

Figure 13:
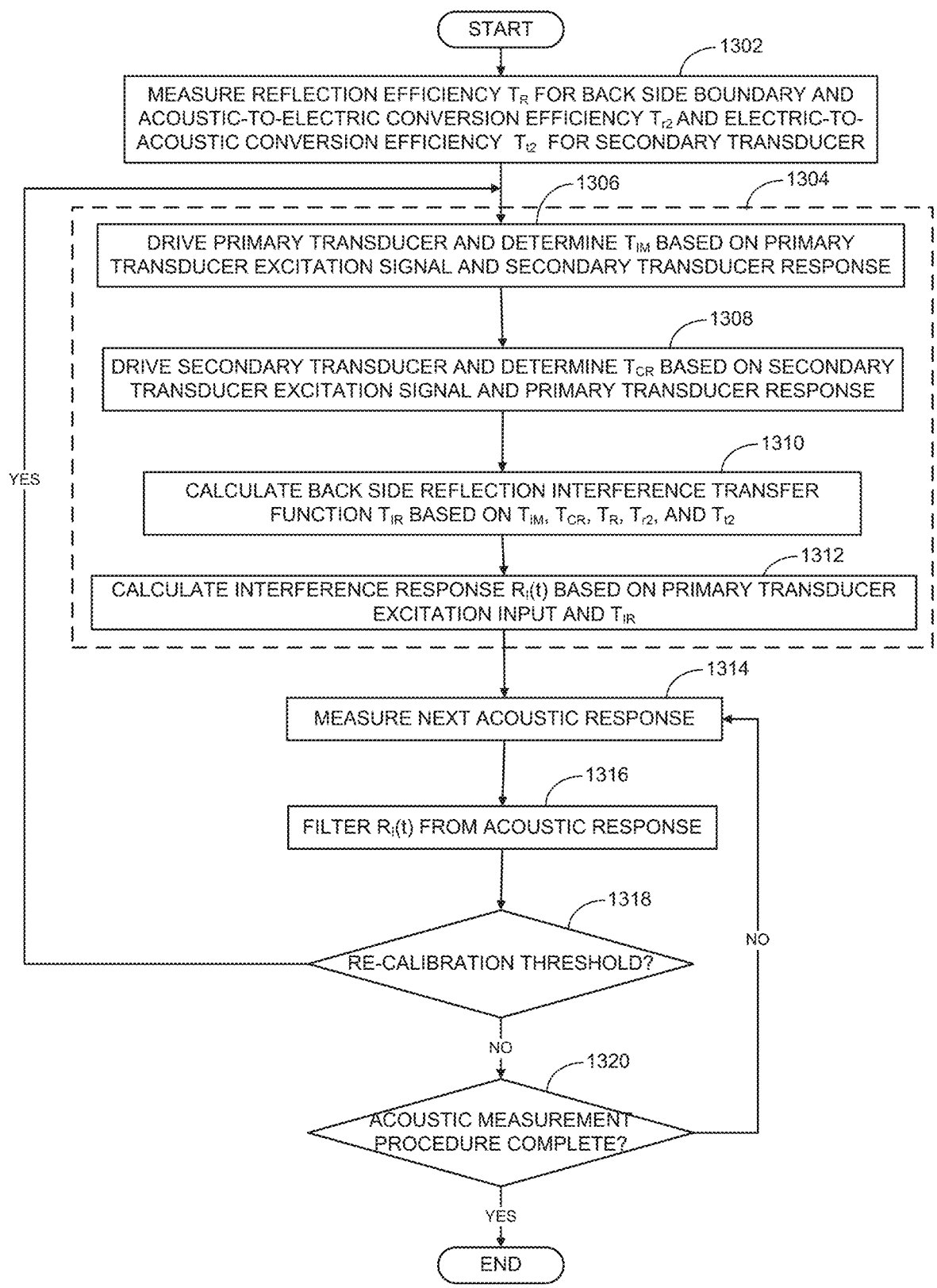
FIG. 13 is a flow diagram depicting operations and functions for mitigating self-induced acoustic interference in accordance with some embodiments.

FIG. 13 is a flow diagram depicting operations and functions for mitigating self-induced acoustic interference in accordance with some embodiments. The operations and functions depicted and described with reference to FIG. 13 may be implemented by one or more of the systems, devices, and components depicted and described with reference to FIGS. 1-12. The process begins as illustrated at block 1302 with measurement tools being utilized to determine properties of an acoustic sensor and operational properties of either or both the primary and secondary transducer within the acoustic sensor. As shown, these properties may include at least a reflection efficiency $T_R$ of the back side of the backing material layer, and an acoustic-to-electric conversion efficiency $T_{r2}$ and an electric-to-acoustic conversion efficiency $T_{t2}$ of the secondary transducer. The properties determined at block 1302 affect internal acoustic propagation properties within the acoustic sensor and are therefore partially determinative of transfer functions such as the $T_{IM}$, $T_{CR}$, and $T_{IR}$ functions described with reference to FIG. 7. For instance, $T_{IM}$ which relates a secondary transducer response with a primary transducer excitation, is a function of and therefore varies based, at least in part, on the acoustic-to-electric conversion efficiency of the secondary transducer. The properties measured or otherwise determined at block 1302 are not substantially sensitive to changes in environmental conditions such as temperature and pressure that may vary widely between different measurement depths within a borehole. These properties may not be adjusted as part of calibration and instead may be collected prior to acoustic measurement operations and loaded as information such as sensor metrics 731 within controller 720 in FIG. 7.

For measurement operations, the acoustic sensor system is configured to implement one or more calibration cycles in addition to the measurement cycles during which acoustic logging data is collected. The calibration cycles are utilized to generate interference signal profiles that may comprise acoustic and electric signal parameters as well as transfer functions that associate back side acoustic wave responses with corresponding excitation signals. In contrast to the properties determined at block 1302, the components of the interference signal profile determined during calibration may include values that significantly dependent on acoustic propagation properties of the acoustic sensor that vary based on environmental conditions such as temperature and pressure. For example, the acoustic propagation properties of the backing material layer may vary based on differences in temperature and pressure at different downhole measurement depth.

Superblock 1304 depicts a set of at least some of the operations and functions included in a calibration cycle. The calibration cycle begins at block 1306 with a sequence of operations for determining a first transfer function $T_{IM}$ that relates the secondary transducer's back side acoustic wave response to a primary transducer excitation signal that induces the back side acoustic waves. A controller, such as controller 720 in FIG. 7, drives a primary transducer with an excitation signal I(t) that induces back side waves into a backing material layer. A secondary transducer responds to the back side acoustic waves by generating a first calibration response M(t). In some embodiments, the controller calculates values for $T_{IM}$ in accordance with the relation: $T_{IM}=M(t)./I(t)$. At block 1308, the controller and other sensor system components perform a sequence of operations for determining a second transfer function $T_{CR}$ that relates the primary transducer's back side acoustic wave response to a secondary transducer excitation signal that induces the back side acoustic waves. The controller drives the secondary transducer with an excitation signal MI(t) that induces back side acoustic waves into the backing material layer. The primary transducer responds to the back side acoustic waves by generating a second calibration response RI(t). In some embodiments, the controller calculates values for $T_{CR}$ in accordance with the relation: $T_{CR}=RI(t)./MI(t)$.

The calibration cycle continues at block 1310 with the controller determining values for a third transfer function $T_{IR}$ based at least in part on the values determined for $T_{IM}$ and $T_{CR}$ and one or more of the sensor operational and acoustic properties determined at block 1320. In some embodiments, the controller calculates $T_{IR}$ in accordance with the relation: $T_{IR}=T_{IM}.*T_{CR}.*T_R./T_{r2}./T_{t2}$. The calibration cycle concludes at block 1312 with the controller determining an interference response $R_i(t)$ based, at least in part, on the primary transducer excitation I(t) and $T_{IR}$. In some embodiments, the controller calculates $R_i(t)$ in accordance with the relation: $R_i(t)=I(t).*T_{IR}$.

Following calibration, the acoustic sensor system executes a next measurement cycle including the primary transducer generating a next total acoustic response (block 1314). The total acoustic response includes echo response components induced externally to the acoustic sensor and may further include reflected back side acoustic interference. At block 1316, the controller or other post measurement processing components filter or otherwise remove signal components from the total acoustic response that correspond or are otherwise determined based on Ri(t). Following the measurement cycle, the controller may determine at inquiry block 1318 whether a re-calibration threshold is met or exceeded. For example, the controller may determine whether a specified number of measurement cycles have been completed and/or whether a specified difference in measurement depth has been met or exceeded. The threshold determination may also or alternatively include temperature and/or pressure values or differences. In response to determining that the threshold is met or exceeded, control passes back to superblock 1304 for a re-calibration sequence. Otherwise, as shown at blocks 1320 and 1314 another measurement cycle is executed at the same or a difference measurement depth until the overall acoustic measurement process is terminated.

Figure 14:
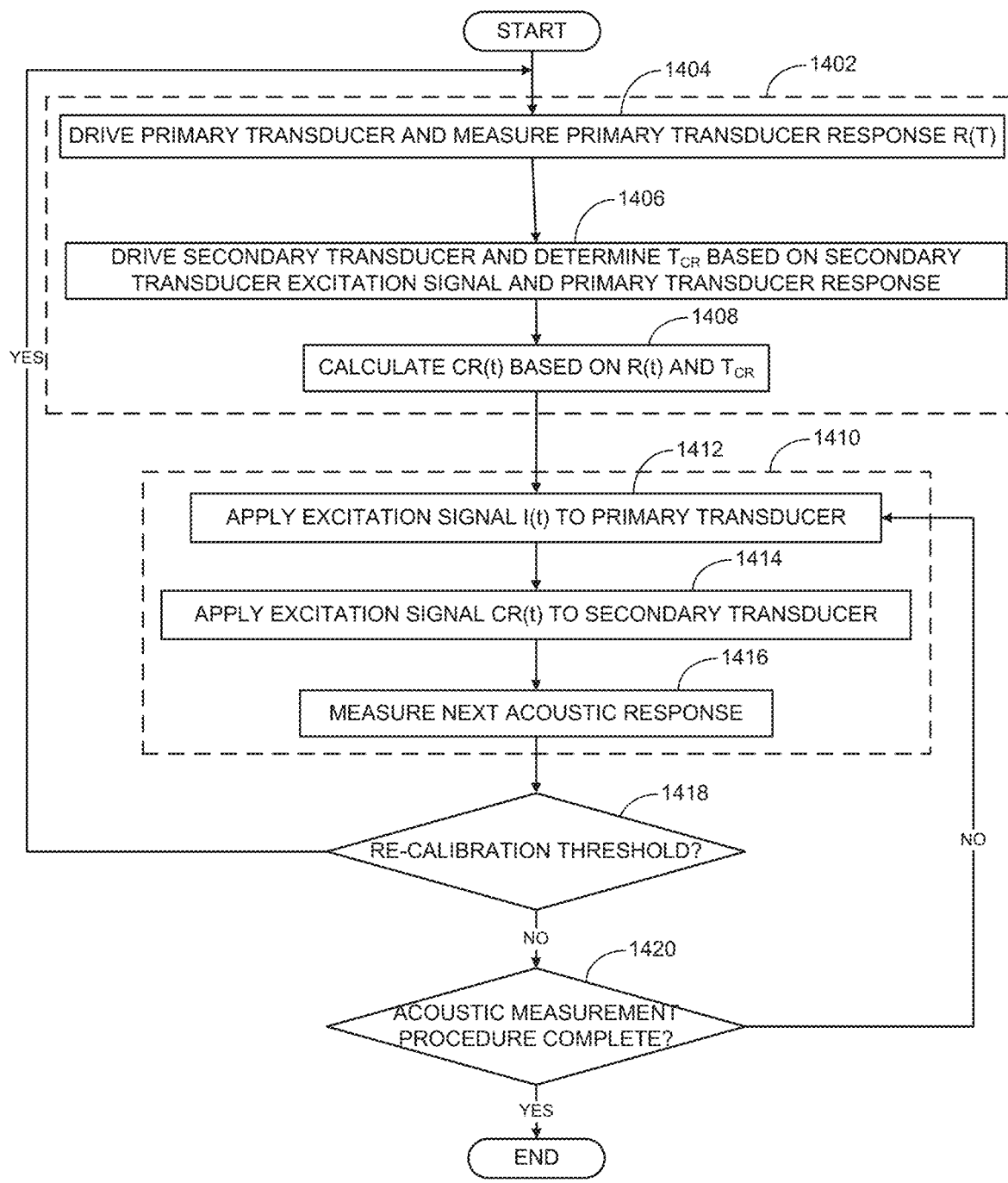
FIG. 14 is a flow diagram illustrating operations and functions for mitigating self-induced acoustic interference in accordance with some embodiments.

FIG. 14 is a flow diagram illustrating operations and functions for mitigating self-induced acoustic interference in accordance with some embodiments. The operations and functions depicted and described with reference to FIG. 14 may be implemented by one or more of the systems, devices, and components depicted and described with reference to FIGS. 1-12. Similar to the process depicted in FIG. 13, the process may include utilizing measurement tools and/or data collection components to determine properties of an acoustic sensor and operational properties of either or both the primary and secondary transducer within the acoustic sensor.

For measurement operations, the acoustic sensor system is configured to implement one or more calibration cycles in addition to the measurement cycles during which acoustic logging data is collected. The calibration cycles are utilized to generate interference signal profiles that may comprise acoustic and electric signal parameters as well as transfer functions that associate back side acoustic wave responses with corresponding excitation signals. Each interference signal profile is utilized to determine the signal parameters of a control signal that may be applied to the secondary transducer during measurement cycles to actively cancel acoustic back side waves during measurement cycles.

Superblock 1402 depicts a set of at least some of the operations and functions included in a calibration cycle, which while not depicted, may include operations such those performed at blocks 1306, 1308, and 1310 of FIG. 13. In the depicted embodiment, the calibration cycle includes the controller driving a primary transducer with an excitation signal I(t) and measuring a corresponding response R(t) of the primary transducer (block 1404). The calibration cycle further includes the controller determining transfer function $T_{CR}$ when excitation MI(t) is applied to the secondary transducer and RI(t) is hence received by the primary transducer. In some embodiments, the controller calculates $T_{CR}$ in accordance with the relation: $T_{CR}=RI(t)./MI(t)$ (block 1406). Calibration may conclude at block 1408 with the controller determining a control signal CR(t) based, at least in part, on a measured primary transducer response R(t) to the primary transducer excitation I(t) and the second transfer function $T_{CR}$ that relates the primary transducer calibration response RI(t) to the secondary transducer excitation signal MI(t). In some embodiments, the controller may calculate CR(t) in accordance with the relation: $CR(t)=-R(t)./T_{CR}$.

Following calibration, the acoustic sensor system executes a next measurement cycle at superblock 1410 that includes an excitation phase in which the controller applies an excitation signal I(t) to the primary transducer to generate a next acoustic response (block 1412). During and at least partially overlapping with the excitation phase, the controller applies the control signal CR(t) as excitation to the secondary transducer to at least partially cancel back side acoustic waves induced by the primary transducer (block 1414). The measurement cycle concludes with the controller measuring or otherwise detecting the echo response generated by the primary transducer during the echo response phase of the measurement cycle (block 1416). Following the measurement cycle, the controller may determine at inquiry block 1418 whether a re-calibration threshold is met or exceeded. In response to determining that the threshold is met or exceeded, control passes back to superblock 1404 for a re-calibration sequence. Otherwise, as shown at blocks 1420 and 1412 another measurement cycle is commenced at the same or a difference measurement depth until the overall acoustic measurement process is terminated.

Figure 15:
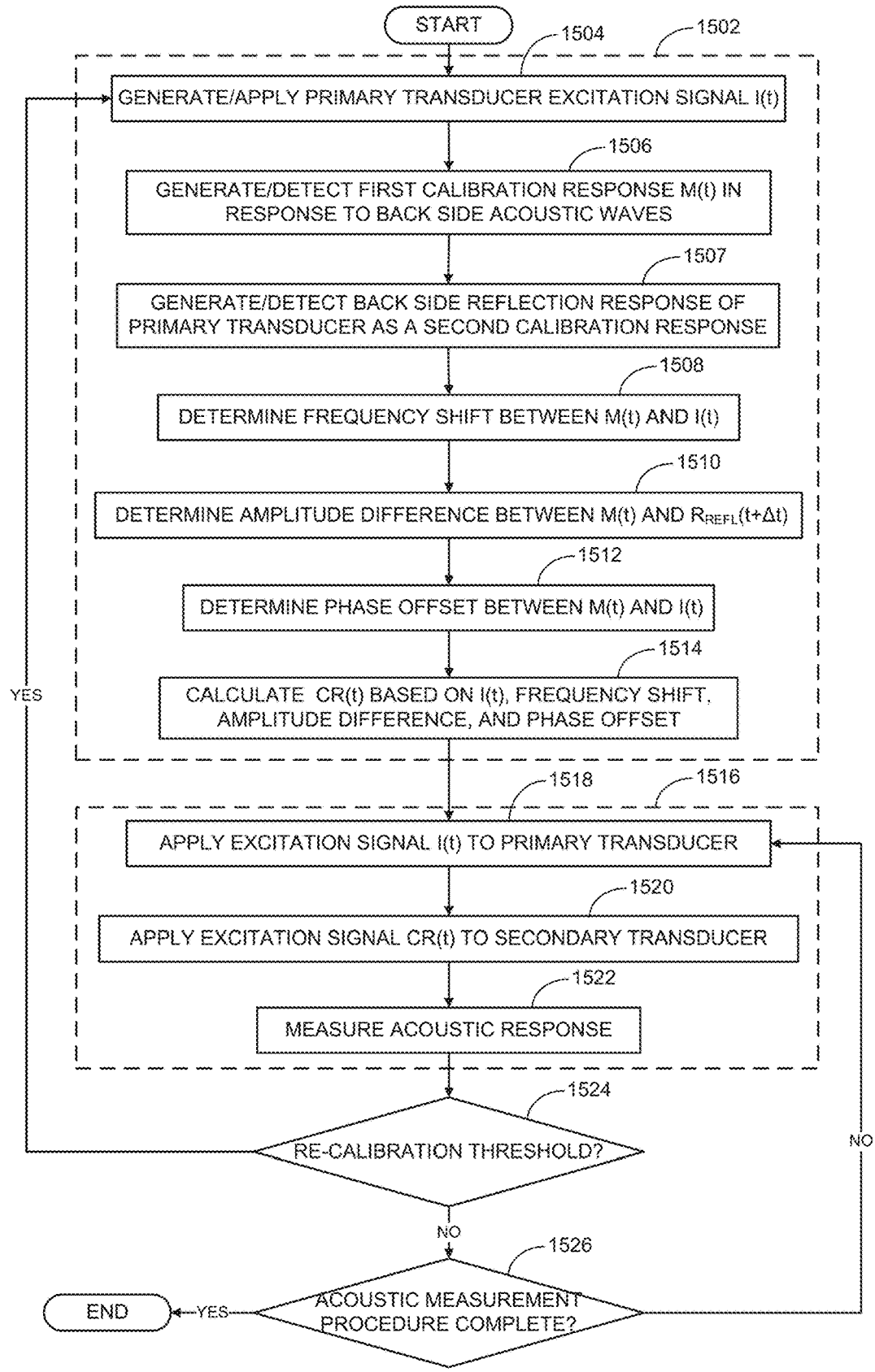
FIG. 15 is a flow diagram depicting operations and functions for mitigating self-induced acoustic interference in accordance with some embodiments.

FIG. 15 is a flow diagram illustrating operations and functions for mitigating self-induced acoustic interference in accordance with some embodiments. The operations and functions depicted and described with reference to FIG. 15 may be implemented by one or more of the systems, devices, and components depicted and described with reference to FIGS. 1-12. For measurement operations, an acoustic sensor system is configured to implement one or more calibration cycles in addition to the measurement cycles during which acoustic logging data is collected. The calibration cycles are utilized to generate interference signal profiles that may comprise acoustic and electric signal metrics and differences between the metrics that associate excitation signals with corresponding responses. Each interference signal profile is utilized to determine the signal parameters of a control signal that may be applied to the secondary transducer during measurement cycles to actively cancel acoustic back side waves during measurement cycles.

The process begins at superblock 1502 with a calibration cycle that includes a set of at least some of the operations and functions for determining an interference signal profile that can be used to generate a control signal. At block 1504, calibration begins with a controller applying an excitation signal I(t) to a primary transducer. At block 1506, a secondary transducer generates a first calibration response M(t) in response to back side acoustic waves induced by the primary transducer. At block 1507, the primary transducer generates a second calibration response in response to reflected components of the back side acoustic waves. Having determined the primary and secondary transducer responses resulting from the primary transducer excitation, the controller determines one or more interference signal profile metrics that may be utilized to generate a control signal.

At block 1508, the controller determines a frequency shift between the first calibration response and the excitation signal I(t). At block 1510, the controller determines an amplitude difference between M(t) and the primary transducer response corresponding to the reflected components of the back side acoustic waves. The determined amplitude difference may be an amplitude difference value and/or a ratio between the amplitudes. At block 1512, the controller determines a phase offset between M(t) and excitation signal I(t). Following the signal metric determination operations at blocks 1508, 1510, and 1512, the controller calculates or otherwise determines signal parameters for a control signal CR(t) based on one or more of the determined phase offset, amplitude difference, and frequency shift (block 1514). In some embodiments, the controller calculates CR(t) in accordance with the relation:

$$CR(t) = -\frac{1}{a} I((t - \Delta t), f_0),$$

wherein t represents time, Δt represents a phase offset between the first calibration response and the first excitation signal, a represents an amplitude ratio between the first calibration response and the second calibration response, I represents the primary transducer excitation signal, and $f_0$ represents a frequency of I. In some embodiments, the controller calculates CR(t) in accordance with the relation $$CR(t) = -\frac{1}{a} I((t - \Delta t), (f_0 - \Delta f)),$$

wherein t represents time, Δt represents a phase offset between the first calibration response and the first excitation signal, a represents an amplitude ratio between the first calibration response and a back side acoustic wave reflection response, I represents the primary transducer excitation signal, $f_0$ represents a frequency of I, and Δf represents the frequency shift between the first calibration response and I.

Following calibration, the acoustic sensor system executes a next measurement cycle at superblock 1516 that includes an excitation phase in which the controller applies an excitation signal I(t) to the primary transducer to generate a next acoustic response (block 1518). During and at least partially overlapping with the excitation phase, the controller applies the control signal CR(t) as excitation to the secondary transducer to at least partially cancel back side acoustic waves induced by the primary transducer (block 1520). The measurement cycle concludes with the controller measuring or otherwise detecting the echo response generated by the primary transducer during the echo response phase of the measurement cycle (block 1522). Following the measurement cycle, the controller may determine at inquiry block 1524 whether a re-calibration threshold is met or exceeded. In response to determining that the threshold is met or exceeded, control passes back to superblock 1502 for a re-calibration sequence. Otherwise, as shown at blocks 1526 and 1518 another measurement cycle is commenced at the same or a difference measurement depth until the overall acoustic measurement process is terminated.

Variations

While the aspects of the disclosure are described with reference to various implementations, these aspects are illustrative and the scope of the claims is not limited thereto. In general, techniques for performing acoustic logging as described herein may be implemented with facilities consistent with any hardware system or hardware systems. Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components.

The flowcharts are provided to aid in understanding the illustrations and are not to be used to limit scope of the claims. The flowcharts depict example operations that can vary within the scope of the claims. The operations may be performed in parallel and/or in a different order. Each block of the flowchart illustrations and/or block diagrams, and combinations of blocks in the flowchart illustrations and/or block diagrams, can be implemented by program code provided to a processor of a general purpose computer, special purpose computer, or other programmable machine or apparatus.

Example Embodiments

Embodiment 1: A method for controlling self-induced acoustic interference, said method comprising: generating, by a first piezoelectric transducer to which a first excitation signal is applied, back side acoustic waves that are transmitted from a back side of the first piezoelectric transducer into a backing material layer; generating, by a second piezoelectric transducer coupled to a back side of the backing material layer, a first calibration response to the back side acoustic waves; and generating an interference signal profile based, at least in part, on the first calibration response. Said generating an interference signal profile may comprise determining values for a first transfer function, $T_{IM}$, that relates the first calibration response to the first excitation signal. Said determining the values for $T_{IM}$ may comprise calculating the values for $T_{IM}$ in accordance with the relation $T_{IM}=M(t)./I(t)$, wherein M(t) represents the first calibration response and I(t) represents the first excitation signal. The method may further comprise generating, by the second piezoelectric transducer to which a second excitation signal is applied, acoustic waves into the backing material layer; generating, by the first piezoelectric transducer, a second calibration response to the acoustic waves generated by the second piezoelectric transducer; and wherein said generating an interference signal profile comprises determining values for a second transfer function, $T_{CR}$, that relates the second calibration response to the second excitation signal. Said determining the second transfer function may comprise calculating the values for the second transfer function, $T_{CR}$, in accordance with the relation $T_{CR}=RI(t)./MI(t)$, wherein RI(t) represents the second calibration response and MI(t) represents the second excitation signal. Said generating an interference signal profile may comprise determining values for a third transfer function, $T_{IR}$, based at least in part on $T_{IM}$ and $T_{CR}$; and determining an interference response, $R_i(t)$, of the first piezoelectric transducer to reflected components of the back side acoustic waves in accordance with the relation $R_i(t)=I(t).*T_{IR}$, wherein I(t) represents the first excitation signal. The method may further comprise obtaining an acoustic response from the first piezoelectric transducer during an acoustic measurement cycle; and removing signal components corresponding to $R_i(t)$ from the acoustic response. The method may further comprise determining an acoustic-to-electric conversion efficiency, $T_{r2}$, and an electric-to-acoustic conversion efficiency, $T_{t2}$, for the second piezoelectric transducer; determining a reflection efficiency, $T_R$, of the back side of the backing material layer; and wherein said generating an interference signal profile comprises calculating values for $T_{IR}$ in accordance with the relation $T_{IR}=T_{IM}.*T_{CR}.*T_R./T_{r2}./T_{t2}$. The method may further comprise determining a control signal based, at least in part, on R(t) and $T_{CR}$, wherein R(t) is a response of the first piezoelectric transducer to I(t); and generating and applying the control signal to the second piezoelectric transducer during an acoustic measurement cycle. The method may further comprise determining the control signal, CR(t), in accordance with the relation $CR(t)=-R(t)./T_{CR}$. Said generating the interference signal profile may further comprise determining a difference between a signal metric for the first calibration response and a signal metric for the first excitation signal; and determining a cancellation factor based, at least in part, on the determined difference. Said determining a difference between a signal metric for the first calibration response and a signal metric for the first excitation signal may comprise determining a phase offset between the first calibration response and the first excitation signal, and said generating the interference signal profile may comprise generating the interference signal profile based, at least in part, on the determined phase offset. The method may further comprise generating a back side acoustic wave reflection response by the first piezoelectric transducer; and determining an amplitude difference between the first calibration response and the back side acoustic wave reflection response. Said generating the interference signal profile may comprise generating the interference signal profile based, at least in part, on the determined amplitude difference. Said determining a difference between a signal metric for the first calibration response and a signal metric for the first excitation signal may comprise determining a frequency shift between the first excitation signal and the first calibration response, and said generating the interference signal profile may comprise generating the interference signal profile based, at least in part, on the determined frequency shift. If the cancellation factor quantifies a phase offset and an amplitude ratio, the method may further comprise generating and applying a control signal to the second piezoelectric transducer during a measurement cycle, wherein the control signal comprises a measurement cycle excitation signal modified by the cancellation factor. The method may further comprise generating the control signal, CR(t), in accordance with the relation $$CR(t) = -\frac{1}{a}I((t-\Delta t), f_0),$$

wherein t represents time, $\Delta t$ represents a phase offset between the first calibration response and the first excitation signal, a represents an amplitude ratio between the first calibration response and a back side acoustic wave reflection response, I represents the first excitation signal, and $f_0$ represents a frequency of the first excitation signal. The method may further comprise determining a frequency difference between the first calibration response and the first excitation signal; and generating the control signal, CR(t), in accordance with the relation $$CR(t) = -\frac{1}{a}I((t-\Delta t), (f_0 - \Delta f)),$$

wherein t represents time, $\Delta t$ represents a phase offset between the first calibration response and the first excitation signal, a represents an amplitude ratio between the first calibration response and a back side acoustic wave reflection response, I represents the first excitation signal, $f_0$ represents a frequency of the first excitation signal, and $\Delta f$ represents the frequency shift between the first calibration response and the first excitation signal. The method may further comprise in response to determining that a calibration threshold is met or exceeded for a subsequent measurement cycle, performing a calibration cycle including: generating, by the second piezoelectric transducer, a third calibration response to back side acoustic waves generated by the first piezoelectric transducer; and modifying the interference signal profile based, at least in part, on the third calibration response.

Embodiment 2: An acoustic tool comprising: a first piezoelectric transducer; a backing material layer comprising an acoustic damping material and having a front side disposed at a back side of said first piezoelectric transducer; and a second piezoelectric transducer having a front side disposed at a back side of said backing material layer, wherein the first and second piezoelectric transducers are configured in operate with a controller to measure acoustic interference during a calibration cycle and to generate an acoustic correction signal that actively cancels at least a portion of an acoustic interference component during an acoustic measurement cycle.

Embodiment 3: A system comprising: an acoustic sensor including a first piezoelectric transducer, a second piezoelectric transducer, and a backing material layer between said first piezoelectric transducer and said second piezoelectric transducer; and a controller communicatively coupled with the acoustic sensor and configured to generate and apply a first excitation signal to the first piezoelectric transducer to induce back side acoustic waves into the backing material layer, detect a first calibration response generated by the first piezoelectric transducer or the second piezoelectric transducer in response to the first excitation signal, and generate an interference signal profile based, at least in part, on the first calibration response. The first calibration response may be generated by the second piezoelectric transducer in response to back side acoustic waves generated by the first piezoelectric transducer, and said generating an interference signal profile may comprise determining values for a first transfer function, $T_{IM}$, that relates the first calibration response to the first excitation signal. For Embodiment 1, the second piezoelectric transducer may be configured to generate acoustic waves into the backing material layer in response to a second excitation signal, the first piezoelectric transducer may be configured to generate a second calibration response to the acoustic waves generated by the second piezoelectric transducer, and said generating an interference signal profile may comprise determining values for a second transfer function, $T_{CR}$, that relates the second calibration response to the second excitation signal. Said generating an interference signal profile may comprise determining values for a third transfer function, $T_{IR}$, based at least in part on the first and second transfer functions, and determining an interference response, $R_i(t)$, of the first piezoelectric transducer to reflected components of the back side acoustic waves in accordance with the relation $R_i(t)=I(t).*T_{IR}$, wherein I(t) represents the first excitation signal. The controller may be configured to obtain an acoustic response from the first piezoelectric transducer during an acoustic measurement cycle, and remove signal components corresponding to $R_i(t)$ from the acoustic response.

What is claimed is:

1. A method comprising:
generating, by a first piezoelectric transducer to which a first excitation signal is applied, back side acoustic waves that are transmitted from a back side of the first piezoelectric transducer into a backing material layer;
generating, by a second piezoelectric transducer coupled to a back side of the backing material layer, a first calibration response to the back side acoustic waves; and
generating an interference signal profile based, at least in part, on the first calibration response.

2. The method of claim 1, wherein said generating the interference signal profile comprises determining values for a first transfer function, $T_{IM}$, that relates the first calibration response to the first excitation signal.

3. The method of claim 2, wherein said determining the values for $T_{IM}$ comprises calculating the values for $T_{IM}$ in accordance with the relation $T_{IM}=M(t)./I(t)$, wherein M(t) represents the first calibration response and I(t) represents the first excitation signal.

4. The method of claim 2, further comprising:
generating, by the second piezoelectric transducer to which a second excitation signal is applied, acoustic waves into the backing material layer;
generating, by the first piezoelectric transducer, a second calibration response to the acoustic waves generated by the second piezoelectric transducer; and
wherein said generating the interference signal profile comprises determining values for a second transfer function, $T_{CR}$, that relates the second calibration response to the second excitation signal.

5. The method of claim 4, wherein said determining values for the second transfer function comprises calculating the values for the second transfer function, $T_{CR}$, in accordance with the relation $T_{CR}=RI(t)./MI(t)$, wherein RI(t) represents the second calibration response and MI(t) represents the second excitation signal.

6. The method of claim 4, wherein said generating the interference signal profile comprises:
determining values for a third transfer function, $T_{IR}$, based at least in part on $T_{IM}$ and $T_{CR}$; and
determining an interference response, $R_i(t)$, of the first piezoelectric transducer to reflected components of the back side acoustic waves in accordance with the relation $R_i(t)=I(t).*T_{IR}$, wherein I(t) represents the first excitation signal.

7. The method of claim 6, further comprising:
obtaining an acoustic response from the first piezoelectric transducer during an acoustic measurement cycle; and
removing signal components corresponding to $R_i(t)$ from the acoustic response.

8. The method of claim 6, further comprising:
determining an acoustic-to-electric conversion efficiency, $T_{r2}$, and an electric-to-acoustic conversion efficiency, $T_{t2}$, for the second piezoelectric transducer;
determining a reflection efficiency, $T_R$, of the back side of the backing material layer; and
and wherein said generating the interference signal profile comprises calculating values for $T_{IR}$ in accordance with the relation $T_{IR}=T_{IM}.*T_{CR}.*T_R./T_{r2}./T_{t2}$.

9. The method of claim 6, further comprising:
determining a control signal based, at least in part, on R(t) and $T_{CR}$, wherein R(t) is a response of the first piezoelectric transducer to I(t); and
generating and applying the control signal to the second piezoelectric transducer during an acoustic measurement cycle.

10. The method of claim 9, further comprising determining the control signal, CR(t), in accordance with the relation $CR(t)=-R(t)./T_{CR}$.

11. The method of claim 1, wherein said generating the interference signal profile comprises:
determining a difference between a signal metric for the first calibration response and a signal metric for the first excitation signal; and
determining a cancellation factor based, at least in part, on the determined difference.

12. The method of claim 11, wherein said determining a difference between a signal metric for the first calibration response and a signal metric for the first excitation signal comprises determining a phase offset between the first calibration response and the first excitation signal, and wherein said generating the interference signal profile comprises generating the interference signal profile based, at least in part, on the determined phase offset.

13. The method of claim 12, further comprising:
generating a back side acoustic wave reflection response by the first piezoelectric transducer;
determining an amplitude difference between the first calibration response and the back side acoustic wave reflection response; and
wherein said generating the interference signal profile comprises generating the interference signal profile based, at least in part, on the determined amplitude difference.

14. The method of claim 12, wherein said determining a difference between a signal metric for the first calibration response and a signal metric for the first excitation signal further comprises determining a frequency shift between the first excitation signal and the first calibration response, and wherein said generating the interference signal profile comprising generating the interference signal profile based, at least in part, on the determined frequency shift.

15. The method of claim 11, wherein the cancellation factor quantifies a phase offset and an amplitude ratio, said method further comprising generating and applying a control signal to the second piezoelectric transducer during a measurement cycle, wherein the control signal comprises a measurement cycle excitation signal modified by the cancellation factor.

16. The method of claim 15, further comprising generating the control signal, CR(t), in accordance with the relation $$CR(t) = -\frac{1}{a}I((t - \Delta t), f_0),$$

wherein t represents time, $\Delta t$ represents a phase offset between the first calibration response and the first excitation signal, a represents an amplitude ratio between the first calibration response and a back side acoustic wave reflection response, I represents the first excitation signal, and $f_0$ represents a frequency of the first excitation signal.

17. The method of claim 15, further comprising:
  determining a frequency difference between the first calibration response and the first excitation signal; and
  generating the control signal, CR(t), in accordance with the relation $$CR(t) = -\frac{1}{a}I((t - \Delta t), (f_0 - \Delta f)),$$

wherein t represents time, $\Delta t$ represents a phase offset between the first calibration response and the first excitation signal, a represents an amplitude ratio between the first calibration response and a back side acoustic wave reflection response, I represents the first excitation signal, $f_0$ represents a frequency of the first excitation signal, and $\Delta f$ represents the frequency shift between the first calibration response and the first excitation signal.

18. The method of claim 15, further comprising, in response to determining that a calibration threshold is met or exceeded for a subsequent measurement cycle, performing a calibration cycle including:
  generating, by the second piezoelectric transducer, a third calibration response to back side acoustic waves generated by the first piezoelectric transducer; and
  modifying the interference signal profile based, at least in part, on the third calibration response.

* * * * *